US012588184B2

(12) United States Patent
Tang

(10) Patent No.: US 12,588,184 B2
(45) Date of Patent: Mar. 24, 2026

(54) TRANSISTOR, SEMICONDUCTOR STRUCTURE, MEMORY, AND METHOD FOR FORMING SAME

(71) Applicant: CHANGXIN MEMORY TECHNOLOGIES, INC., Hefei City (CN)

(72) Inventor: Yi Tang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 437 days.

(21) Appl. No.: 18/168,542

(22) Filed: Feb. 13, 2023

(65) Prior Publication Data

US 2024/0098966 A1 Mar. 21, 2024

(30) Foreign Application Priority Data

Sep. 19, 2022 (CN) .......................... 202211139699.0

(51) Int. Cl.
*H10B 12/00* (2023.01)
(52) U.S. Cl.
CPC ........... *H10B 12/053* (2023.02); *H10B 12/37* (2023.02); *H10B 12/482* (2023.02); *H10B 12/488* (2023.02)

(58) Field of Classification Search
CPC ...... H10B 12/05; H10B 12/053; H10B 12/37; H10B 12/482; H10B 12/488; H10D 1/714
See application file for complete search history.

(56) References Cited

U.S. PATENT DOCUMENTS

| | | |
|---|---|---|
| 11,335,686 B2 | 5/2022 | Gomes |
| 2021/0005746 A1* | 1/2021 | Suto ..................... H10D 62/107 |

FOREIGN PATENT DOCUMENTS

CN 101044615 A 9/2007

* cited by examiner

*Primary Examiner* — Hoai V Pham
(74) *Attorney, Agent, or Firm* — Syncoda LLC; Feng Ma

(57) ABSTRACT

A transistor includes a source structure, a trench, a drain structure, and a gate structure. The trench sequentially has first and second end faces which are arranged opposite in a first direction. The source structure extends from the first end face in a second direction. The source structure sequentially has third and fourth end faces which are arranged opposite in the first direction. The fourth end face is connected to the first end face. The drain structure extends from the second end face in a direction opposite to the second direction. The drain structure sequentially has fifth and sixth end faces which are arranged opposite in the first direction. The fifth end face is connected to the second end face. The second direction intersects the first direction. The gate structure surrounds the trench and is connected to the fourth and the fifth end face.

17 Claims, 20 Drawing Sheets

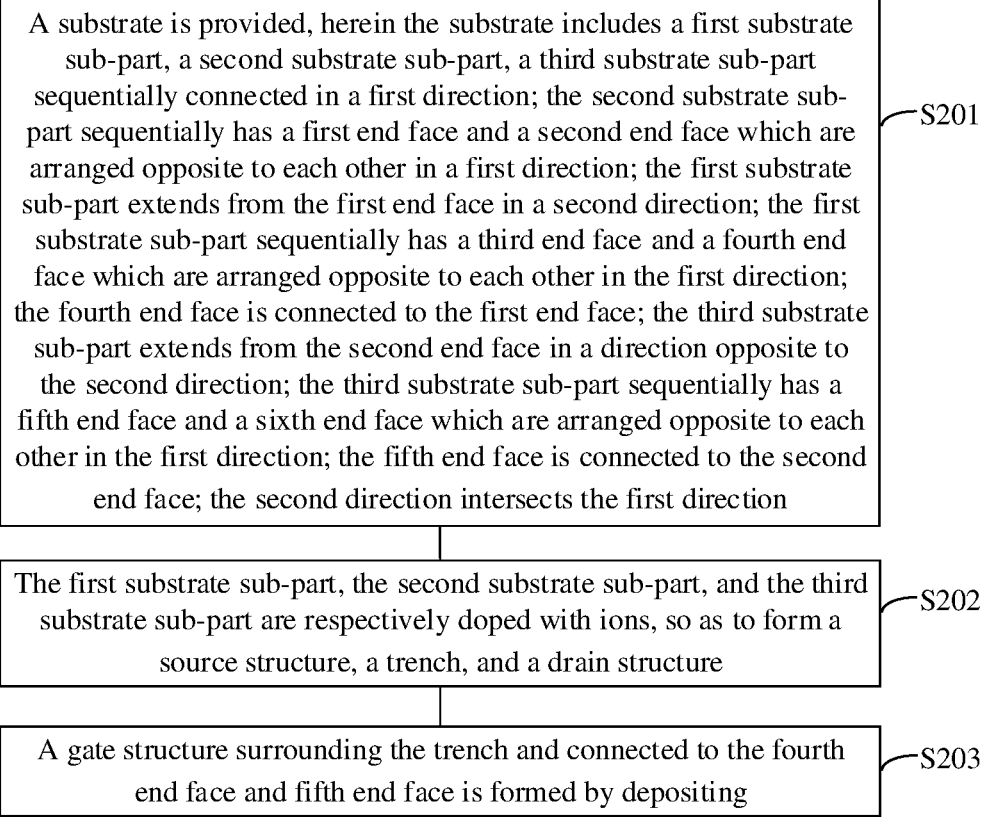

A substrate is provided, herein the substrate includes a first substrate sub-part, a second substrate sub-part, a third substrate sub-part sequentially connected in a first direction; the second substrate sub-part sequentially has a first end face and a second end face which are arranged opposite to each other in a first direction; the first substrate sub-part extends from the first end face in a second direction; the first substrate sub-part sequentially has a third end face and a fourth end face which are arranged opposite to each other in the first direction; the fourth end face is connected to the first end face; the third substrate sub-part extends from the second end face in a direction opposite to the second direction; the third substrate sub-part sequentially has a fifth end face and a sixth end face which are arranged opposite to each other in the first direction; the fifth end face is connected to the second end face; the second direction intersects the first direction ~S201

The first substrate sub-part, the second substrate sub-part, and the third substrate sub-part are respectively doped with ions, so as to form a source structure, a trench, and a drain structure ~S202

A gate structure surrounding the trench and connected to the fourth end face and fifth end face is formed by depositing ~S203

FIG. 2A

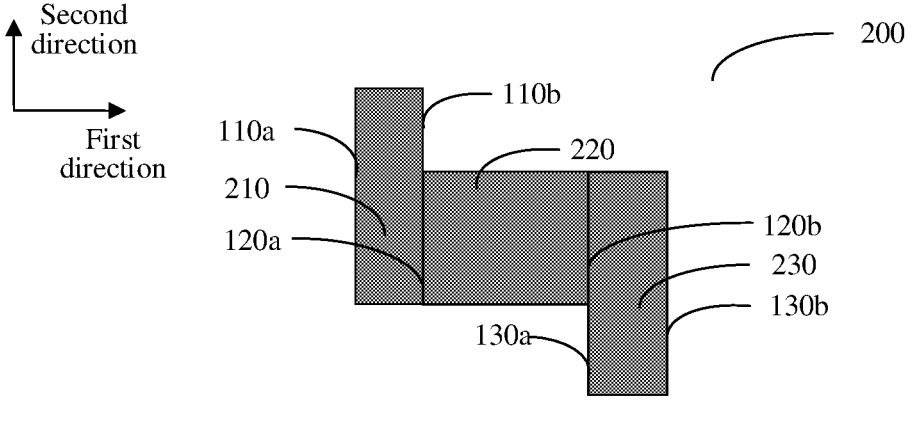

FIG. 2B

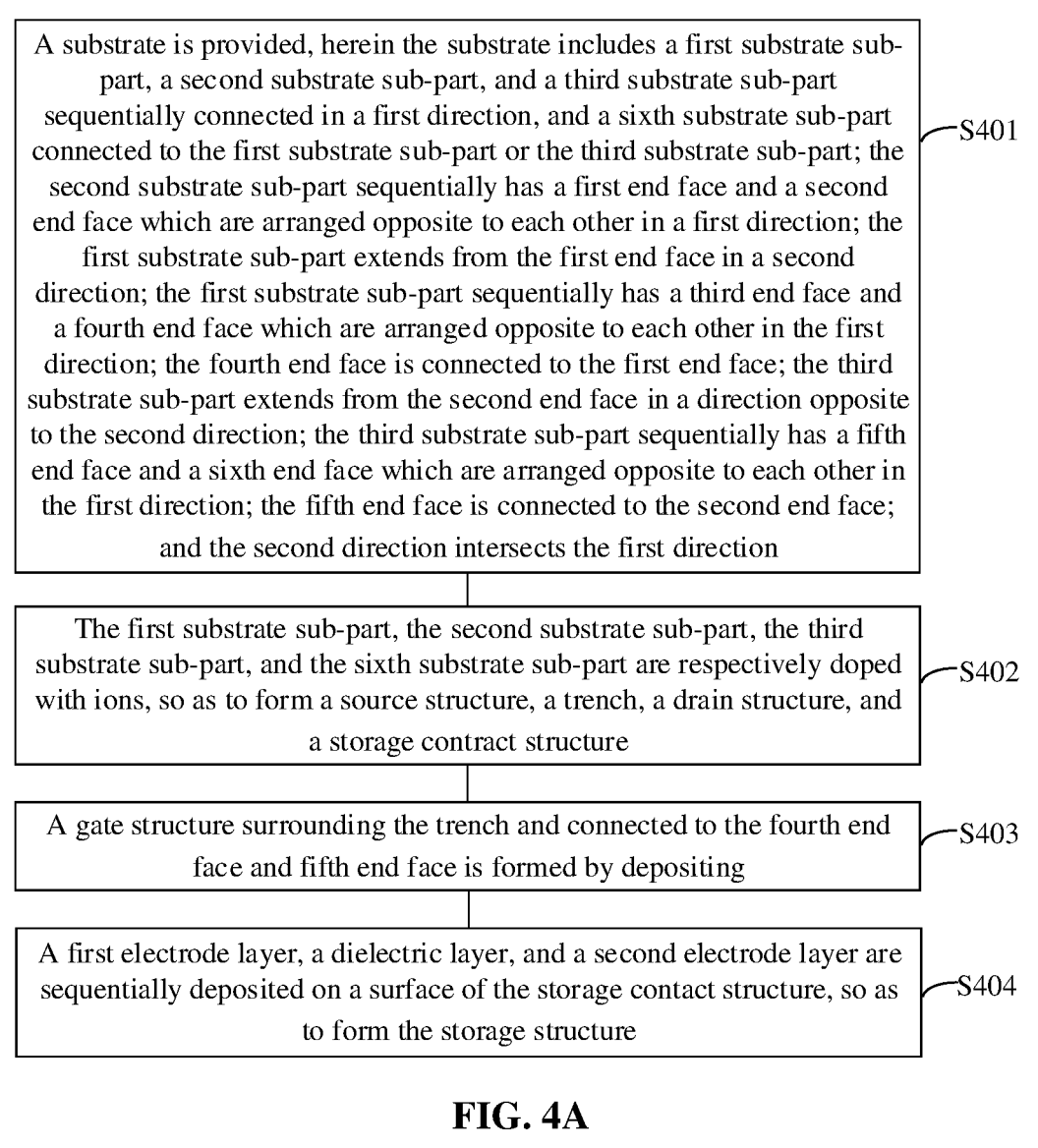

A substrate is provided, herein the substrate includes a first substrate sub-part, a second substrate sub-part, and a third substrate sub-part sequentially connected in a first direction, and a sixth substrate sub-part connected to the first substrate sub-part or the third substrate sub-part; the second substrate sub-part sequentially has a first end face and a second end face which are arranged opposite to each other in a first direction; the first substrate sub-part extends from the first end face in a second direction; the first substrate sub-part sequentially has a third end face and a fourth end face which are arranged opposite to each other in the first direction; the fourth end face is connected to the first end face; the third substrate sub-part extends from the second end face in a direction opposite to the second direction; the third substrate sub-part sequentially has a fifth end face and a sixth end face which are arranged opposite to each other in the first direction; the fifth end face is connected to the second end face; and the second direction intersects the first direction ⌐S401

The first substrate sub-part, the second substrate sub-part, the third substrate sub-part, and the sixth substrate sub-part are respectively doped with ions, so as to form a source structure, a trench, a drain structure, and a storage contract structure ⌐S402

A gate structure surrounding the trench and connected to the fourth end face and fifth end face is formed by depositing ⌐S403

A first electrode layer, a dielectric layer, and a second electrode layer are sequentially deposited on a surface of the storage contact structure, so as to form the storage structure ⌐S404

FIG. 4A

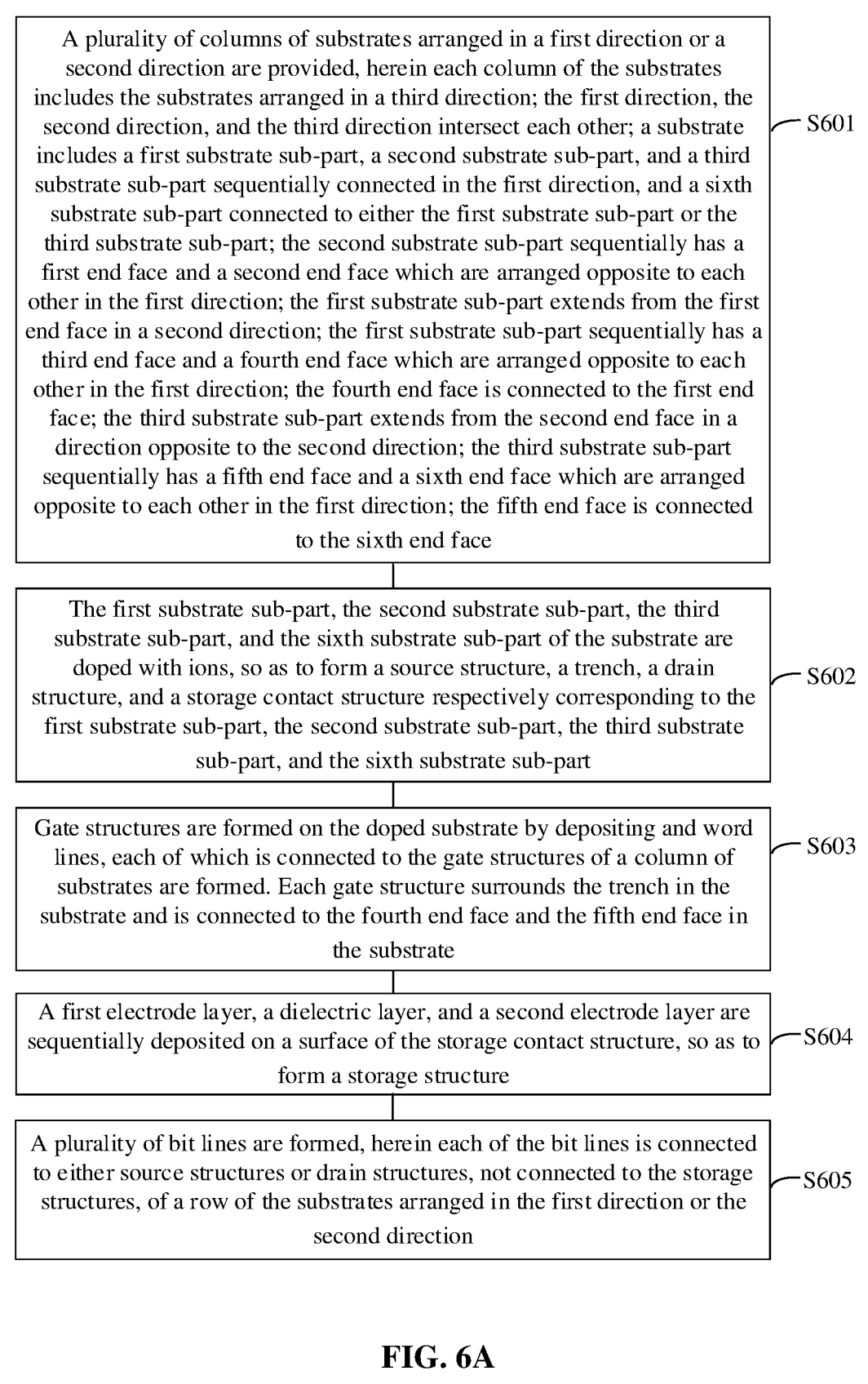

A plurality of columns of substrates arranged in a first direction or a second direction are provided, herein each column of the substrates includes the substrates arranged in a third direction; the first direction, the second direction, and the third direction intersect each other; a substrate includes a first substrate sub-part, a second substrate sub-part, and a third substrate sub-part sequentially connected in the first direction, and a sixth substrate sub-part connected to either the first substrate sub-part or the third substrate sub-part; the second substrate sub-part sequentially has a first end face and a second end face which are arranged opposite to each other in the first direction; the first substrate sub-part extends from the first end face in a second direction; the first substrate sub-part sequentially has a third end face and a fourth end face which are arranged opposite to each other in the first direction; the fourth end face is connected to the first end face; the third substrate sub-part extends from the second end face in a direction opposite to the second direction; the third substrate sub-part sequentially has a fifth end face and a sixth end face which are arranged opposite to each other in the first direction; the fifth end face is connected to the sixth end face — S601

The first substrate sub-part, the second substrate sub-part, the third substrate sub-part, and the sixth substrate sub-part of the substrate are doped with ions, so as to form a source structure, a trench, a drain structure, and a storage contact structure respectively corresponding to the first substrate sub-part, the second substrate sub-part, the third substrate sub-part, and the sixth substrate sub-part — S602

Gate structures are formed on the doped substrate by depositing and word lines, each of which is connected to the gate structures of a column of substrates are formed. Each gate structure surrounds the trench in the substrate and is connected to the fourth end face and the fifth end face in the substrate — S603

A first electrode layer, a dielectric layer, and a second electrode layer are sequentially deposited on a surface of the storage contact structure, so as to form a storage structure — S604

A plurality of bit lines are formed, herein each of the bit lines is connected to either source structures or drain structures, not connected to the storage structures, of a row of the substrates arranged in the first direction or the second direction — S605

FIG. 6A

TRANSISTOR, SEMICONDUCTOR STRUCTURE, MEMORY, AND METHOD FOR FORMING SAME

CROSS-REFERENCE TO RELATED APPLICATION

This application claims priority to Chinese Patent Application No. 202211139699.0 filed on Sep. 19, 2022, the disclosure of which is hereby incorporated by reference in its entirety.

BACKGROUND

With the increase of the integration degree of semiconductor devices, the dimension of each element in a semiconductor device and the spacing between various elements are continuously reduced, so the design requirements for the morphology of each element are increasingly higher. Taking a transistor as an example, the transistor usually includes a source structure, a trench, a drain structure, and a gate structure. With continuous decrease of the dimension of the transistor, the morphology of the gate structure also changes discontinuously to improve the control capability of the gate structure with a small dimension on the trench. However, it is usually difficult to control the morphology of the gate structure in a formation process of the transistor.

SUMMARY

In view of this, embodiments of the disclosure provide a transistor, a semiconductor structure, a memory, a method for forming a semiconductor structure, and a method for forming a memory.

The embodiments of the disclosure provide a transistor, which includes:

a source structure, a trench, a drain structure, and a gate structure.

The trench sequentially has a first end face and a second end face which are arranged opposite to each other in a first direction. The source structure extends from the first end face in a second direction. The source structure sequentially has a third end face and a fourth end face which are arranged opposite to each other in the first direction. The fourth end face is connected to the first end face. The drain structure extends from the second end face in a direction opposite to the second direction. The drain structure sequentially has a fifth end face and a sixth end face which are arranged opposite to each other in the first direction. The fifth end face is connected to the second end face. The second direction intersects the first direction.

The gate structure surrounds the trench and is connected to the fourth end face and the fifth end face.

The embodiments of the disclosure provide a semiconductor structure, which includes:

the transistor as described in the above-mentioned embodiments; and a storage structure connected to either the source structure or the drain structure of the transistor.

The embodiments of the disclosure provide a method for forming a semiconductor structure, which includes the following operations.

A substrate is provided. The substrate includes a first substrate sub-part, a second substrate sub-part, and a third substrate sub-part sequentially connected in a first direction, and a sixth substrate sub-part connected to the first substrate sub-part or the third substrate sub-part. The second substrate sub-part sequentially has a first end face and a second end face which are arranged opposite to each other in the first direction. The first substrate sub-part extends from the first end face in a second direction. The first substrate sub-part sequentially has a third end face and a fourth end face which are arranged opposite to each other in the first direction. The third substrate sub-part extends from the second end face in a direction opposite to the second direction. The third substrate sub-part sequentially has a fifth end face and a sixth end face which are arranged opposite to each other in the first direction. The second direction intersects the first direction.

The first substrate sub-part, the second substrate sub-part, the third substrate sub-part, and the sixth substrate sub-part of the substrate are doped with ions, so as to form a source structure, a trench, a drain structure, and a storage contract structure respectively corresponding to the first substrate sub-part, the second substrate sub-part, the third substrate sub-part, and the sixth substrate sub-part.

A gate structure surrounding the trench and connected to the fourth end face and fifth end face is formed by depositing.

A first electrode layer, a dielectric layer, and a second electrode layer are sequentially deposited on a surface of storage contact structure, so as to form the storage structure.

The embodiments of the disclosure provide a memory, which includes:

a plurality of semiconductor structures as described in the above-mentioned embodiments arranged in an array, a plurality of word lines, and a plurality of bit lines.

The plurality of semiconductor structures arranged in an array include a plurality of columns of the semiconductor structures arranged in the first direction or the second direction. Each column of the semiconductor structures includes the semiconductor structures arranged in a third direction. Each of the word lines is connected to gate structures of the transistors in a column of semiconductor structures. Each of the bit lines is connected to either the source structures or the drain structures, not connected to the storage structures, of a row of the semiconductor structures arranged in the first direction or the second direction. The third direction intersects both the first direction and the second direction.

The embodiments of the disclosure provide a method for forming a memory, which includes the following operations.

A plurality of columns of substrates arranged in a first direction or a second direction are provided. Each column of the substrates includes the substrates arranged in a third direction. The first direction, the second direction, and the third direction intersect each other. The substrate includes a first substrate sub-part, a second substrate sub-part, and a third substrate sub-part sequentially connected in the first direction, and a sixth substrate sub-part connected to either the first substrate sub-part or the third substrate sub-part. The second substrate sub-part sequentially has a first end face and a second end face which are arranged opposite to each other in a first direction. The first substrate sub-part extends from the first end face in the second direction. The first substrate sub-part sequentially has a third end face and a fourth end face which are arranged opposite to each other in the first direction. The third substrate sub-part extends from the second end face in a direction opposite to the second direction. The third substrate sub-part sequentially has a fifth end face and a sixth end face which are arranged opposite to each other in the first direction.

The first substrate sub-part, the second substrate sub-part, the third substrate sub-part, and the sixth substrate sub-part are doped with ions, so as to form a source structure, a trench, a drain structure, and a storage contract structure respectively corresponding to the first substrate sub-part, the second substrate sub-part, the third substrate sub-part, and the sixth substrate sub-part.

Gate structures are formed on the doped substrate by depositing and word lines, each of which is connected to the gate structures of a column of the substrates. The gate structure surrounds the trench in the substrate, and is connected to the fourth end face and the fifth end face in the substrate.

A first electrode layer, a dielectric layer, and a second electrode layer are sequentially deposited on a surface of the storage contact structure, so as to form a storage structure.

A plurality of bit lines are formed. Each of the bit lines is connected to either the source structures or the drain structures, not connected to the storage structures, of a row of substrates arranged in the first direction or the second direction.

BRIEF DESCRIPTION OF THE DRAWINGS

FIG. 2A illustrates an implementation flowchart of a method for forming a transistor provided by the embodiments of the disclosure.

FIG. 2B illustrates a schematic diagram of composition structures of a substrate provided by the embodiments of the disclosure.

FIG. 4A illustrates an implementation flowchart of a method for forming a semiconductor structure provided by the embodiments of the disclosure.

FIG. 6A illustrates an implementation flowchart of a method for forming a memory provided by the embodiments of the disclosure.

DETAILED DESCRIPTION

Figure 1A:
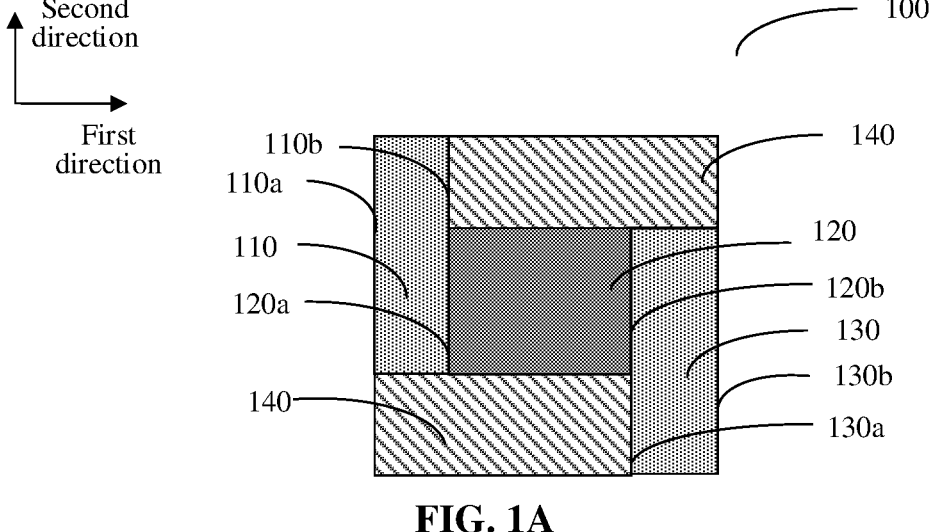
FIG. 1A illustrates a sectional view of a transistor in a plane where a first direction and a second direction are located provided by the embodiments of the disclosure.

The disclosure relates, but is not limited to the technical field of semiconductors, and in particular, to a transistor, a semiconductor structure, a memory, a method for forming a semiconductor structure, and a method for forming a memory.

In order to make the purposes, technical solutions, and advantages of the disclosure more clear, the technical solutions of the disclosure are further described in detail below with reference to the drawings and embodiments. The described embodiments should not be regarded as limitations to the disclosure. All other embodiments obtained by those of ordinary skill in the art without creative work fall within the scope of protection of the disclosure.

"Some embodiments" involved in the following descriptions describes a subset of all possible embodiments. However, it can be understood that "some embodiments" may be the same subset or different subsets of all the possible embodiments, and may be combined without conflicts. In the following description, the terms "first\second\third" are only used to distinguish similar objects, and does not represent a specific order for objects. It is to be understood that "first\second\third" can be interchanged with a specific order or sequence when allowed, so that embodiments of the disclosure described herein can be implemented in a sequence other than those illustrated or described here.

Unless otherwise defined, all technical and scientific terms used herein shall have the same meanings as commonly understood by those skilled in the art to which the disclosure belongs. The terms used herein are only intended to describe the embodiments of the disclosure, and are not intended to limit the disclosure.

In the drawings, the dimensions of layers, areas, and elements and their relative dimensions may be exaggerated for clarity. Throughout, the same drawing signs represent the same elements.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when the second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing a three-dimensional structure that may be used in the following embodiments, a first direction, a second direction, and a third direction, are defined. The first direction, the second direction, and the third direction intersect with each other. In some embodiments, the first direction, the second direction, and the third direction are perpendicular to each other. Taking the Cartesian coordinate system as an example, the three directions may include an X-axis direction (corresponding to the first direction), a Y-axis direction (corresponding to the second direction), and a Z-axis direction (corresponding to the third direction). For example, an extending direction of a trench in a transistor may be defined as the first direction, an extending direction of a source structure may be defined as the second direction, and an arrangement direction of various transistors of one column of transistors may be defined as the third direction. A plane direction of the transistors may be defined based on the first direction and the second direction. The transistor may include a top surface parallel to the plane and a bottom surface opposite to the top surface. The direction perpendicular to the top surface and the bottom surface of the base is defined as the third direction in a case of ignoring the flatness of the top surface and the bottom surface.

Figure 1B:
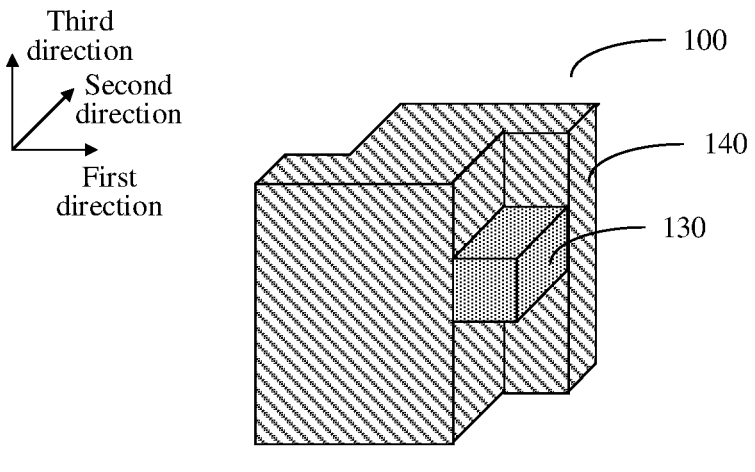
FIG. 1B illustrates a three-dimensional schematic diagram of the transistor in FIG. 1A provided by the embodiments of the disclosure.

The embodiments of the disclosure provide a transistor. FIG. 1A and FIG. 1B respectively illustrate a sectional view of a transistor in a plane where a first direction and a second direction are located and a three-dimensional schematic diagram of the transistor provided by the embodiments of the disclosure. As shown in FIG. 1A and FIG. 1B, a transistor 100 includes:

a source structure 110, a trench 120, a drain structure 130, and a gate structure 140.

The trench 120 sequentially has a first end face 120a and a second end face 120b which are arranged opposite to each other in a first direction. The source structure 110 extends from the first end face 120a in a second direction. The source structure 110 sequentially has a third end face 110a and a fourth end face 110b which are arranged opposite to each other in the first direction. The fourth end face 110b is connected to the first end face 120a. The drain structure 130 extends from the second end face 120b in a direction opposite to the second direction. The drain structure 130 sequentially has a fifth end face 130a and a sixth end face 130b which are arranged opposite to each other in the first direction. The fifth end face 130a is connected to the second end face 120b. The second direction intersects the first direction.

The gate structure 140 surrounds the trench 120 and is connected to the fourth end face 110b and the fifth end face 130a.

During implementation, the first direction and the second direction may be any two intersecting directions determined according to actual situations, and the first direction and the second direction may intersect at any suitable angle. No limits are made thereto in the embodiments of the disclosure. For example, an included angle between the first direction and the second direction may be 45°, 80°, 90°, 100°, 135°, or the like.

During implementation, the gate structure may surround the trench by taking the axis of the trench in the first direction as a center axis.

In some embodiments, the gate structure may include a gate insulating layer and a gate electrode. The gate insulating layer surrounds the trench and is connected to the fourth end face and the fifth end face. The gate electrode covers the gate insulating layer. During implementation, the gate electrode may include, but is not limited to, at least one of a metal gate, a polysilicon gate, or the like.

In the embodiments of the disclosure, a transistor includes a source structure, a trench, a drain structure, and a gate structure. The trench sequentially has a first end face and a second end face which are arranged opposite to each other in a first direction. The source structure extends from the first end face in a second direction. The source structure sequentially has a third end face and a fourth end face which are arranged opposite to each other in the first direction. The fourth end face is connected to the first end face. The drain structure extends from the second end face in a direction opposite to the second direction. The drain structure sequentially has a fifth end face and a sixth end face which are arranged opposite to each other in the first direction. The fifth end face is connected to the second end face. The second direction intersects the first direction. The gate structure surrounds the trench and is connected to the fourth end face and the fifth end face. Thus, in an aspect, the trench sequentially has the first end face and the second end face which are arranged opposite to each other in the first direction, the source structure extends from the first end face in the second direction, and the drain structure extends from the second end face in the direction opposite to the second direction, so that the source structure, the trench, and the drain structure form a Z-like structure. The gate structure surrounds the trench and is connected to the fourth end face of the source structure and the fifth end face of the drain structure, so that the morphology of the gate structure surrounding the trench can be conveniently controlled through the morphology of the fourth end face of the source structure and the morphology of the fifth end face of the drain structure; by doing so, a connecting face of the gate structure and the fourth end face is aligned with the first end face of the trench, and a connecting face of the gate structure and the fifth end face is aligned with the second end face of the trench. In another aspect, the second direction intersects the first direction, so that the dimensions of the source structure and the gate structure in the first direction are reduced, and then the dimension of the transistor in the first direction can be further reduced. In yet another aspect, since the gate structure surrounds the trench, the control capability of the gate structure to the trench can be improved.

Figure 1C:
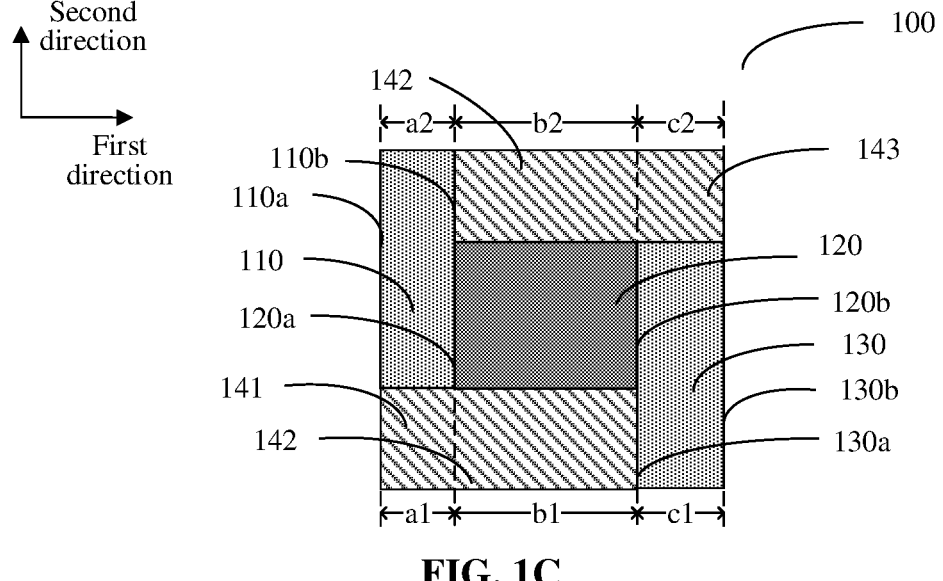
FIG. 1C illustrates a sectional view of a transistor in the plane where a first direction and a second direction are located provided by the embodiments of the disclosure.
Figure 1D:
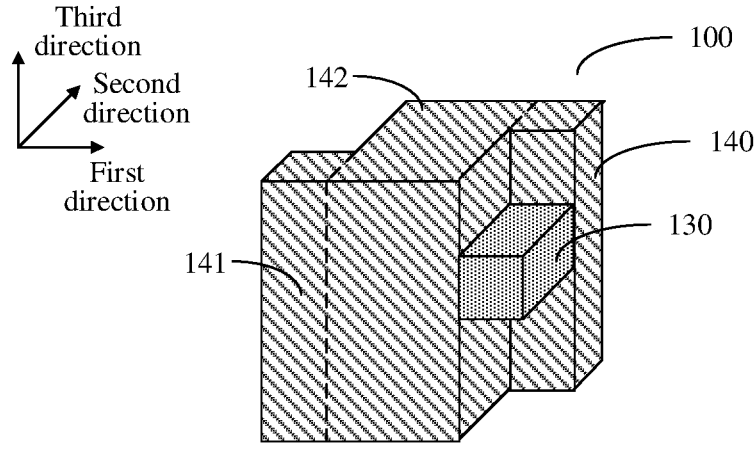
FIG. 1D illustrates a three-dimensional schematic diagram of the transistor in FIG. 1C provided by the embodiments of the disclosure.

In some embodiments, referring to FIG. 1C and FIG. 1D, the gate structure 140 includes a first gate sub-part 141, a second gate sub-part 142, and a third gate sub-part 143 sequentially connected in the first direction. The first gate sub-part 141 and the source structure 110 are sequentially connected in the second direction. The second gate sub-part 142 completely surrounds the trench 120 and is connected to the fourth end face 110b and the fifth end face 130a. The drain structure 130 and the third gate sub-part 143 are sequentially connected in the second direction. In the first direction, the dimension a1 of the first gate sub-part 141 is the same as the dimension a2 of the source structure 110. The dimension b1 of the second gate sub-part 142 is the same as the dimension b2 of the trench 120. The dimension c1 of the third gate sub-part 143 is the same as the dimension c2 of the drain structure 130. Here, each of the first gate sub-part and the third gate sub-part can control the trench at a single side, and the second gate sub-part can surround and control the trench, so that the control capability of the gate structure to the trench can be effectively improved. In addition, in the first direction, the dimension of the first gate sub-part is the same as the dimension of the source structure, and the dimension of the third gate sub-part is the same as the dimension of the drain structure, such that the control capability of the gate structure to the trench can be further improved, and the morphology of the gate structure can be further controlled through the third end face of the source structure and the sixth end face of the drain structure.

In some embodiments, the first gate sub-part, the second gate sub-part and the third gate sub-part have the same dimension in the third direction, and the third direction intersects the first direction and the second direction. Thus, the control of the morphology of the gate structure in the third direction can be facilitated.

Figure 1E:
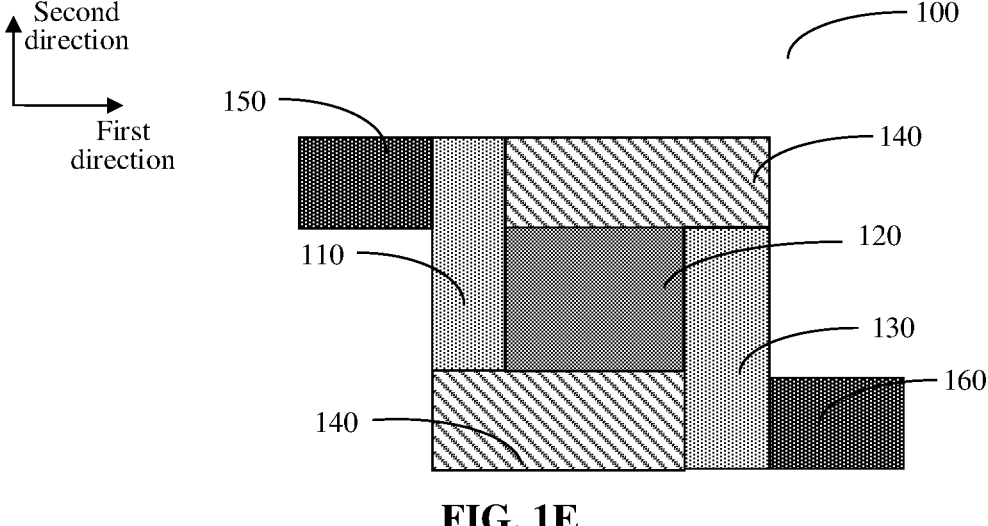
FIG. 1E illustrates a sectional view of a transistor in the plane where a first direction and a second direction are located provided by the embodiments of the disclosure.
Figure 1F:
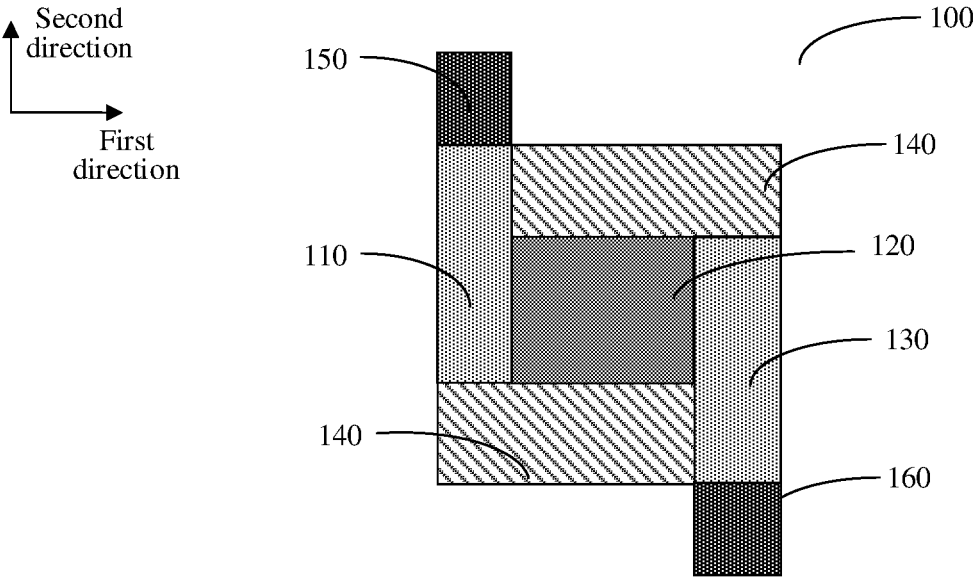
FIG. 1F illustrates a sectional view of a transistor in the plane where a first direction and a second direction are located provided by the embodiments of the disclosure.

In some embodiments, as shown in FIG. 1E or FIG. 1F, the transistor 100 further includes a source expansion structure 150 connected to the source structure 110, and a drain expansion structure 160 connected to the drain structure 130. Both the source structure 110 and the drain structure 130 are doped with first ions with a first concentration, both the source extension structure 150 and the drain extension structure 160 are doped with first ions with a second concentration, and the second concentration is higher than the first concentration. The trench 120 is doped with second ions of a third concentration, and the first ions and the second ions have opposite polarities. Here, the trench may be doped with the second ions. The first ions may be the ions with an opposite polarity to the second ions. During implementation, the first concentration, the second concentration, and the third concentration may be set according to actual situations. No limits are made thereto in the embodiments of the disclosure. In some embodiments, the doping of the first ions with the first concentration may be light doping or medium doping, and the first concentration may be, for example, $1*10^{13}$ to $1*10^{16}$ cm$^{-3}$, or $1*10^{17}$ to $9*10^{18}$ cm$^{-3}$; and the doping of the first ions with the second concentration can be heavy doping, and the second concentration may be, for example, $1*10^{19}$ to $1*10^{21}$ cm$^{-3}$.

In some embodiments, the first ions may be N-type doped ions, and the second ions may be P-type doped ions. In some embodiments, the first ions may be P-type doped ions, and the second ions may be N-type doped ions.

In some embodiments, referring to FIG. 1E, the source extension structure 150 and the source structure 110 are sequentially connected in the first direction, and the drain structure 130 and the drain extension structure 160 are sequentially connected in the first direction.

In some embodiments, referring to FIG. 1F, the source structure 110 and the source extension structure 150 are sequentially connected in the second direction; and the drain extension structure 160 and the drain structure 130 are sequentially connected in the second direction.

The embodiments of the disclosure provide a method for forming a transistor. FIG. 2A illustrates an implementation flowchart of a method for forming a transistor provided by the embodiments of the disclosure. As shown in FIG. 2A, the method includes the following S201 to S203.

At S201, a substrate is provided. The substrate includes a first substrate sub-part, a second substrate sub-part, and a third substrate sub-part sequentially connected in a first direction. The second substrate sub-part sequentially has a first end face and a second end face which are arranged opposite to each other in the first direction. The first substrate sub-part extends from the first end face in a second direction. The first substrate sub-part sequentially has a third end face and a fourth end face which are arranged opposite to each other in the first direction. The fourth end face is connected to the first end face. The third substrate sub-part extends from the second end face in a direction opposite to the second direction. The third substrate sub-part sequentially has a fifth end face and a sixth end face which are arranged opposite to each other in the first direction. The fifth end face is connected to the second end face. The second direction intersects the first direction.

Here, the substrate may be a silicon substrate, a silicon germanium substrate, Silicon-On-Insulator (SOI) substrate, etc. In some embodiments, the substrate may also include other semiconductor elements or semiconductor compounds such as Silicon Carbide (SiC), Gallium Arsenide (GaAs), Gallium Phosphide (GaP), Indium Phosphide (InP), Indium Arsenide (InAs) or Indium Antimonide (InSb), or other semiconductor alloys such as Gallium Arsenic Phosphide (GaAsP), Aluminum Indium Arsenide (AlInAs), Aluminum Gallium Arsenide (AlGaAs), Gallium Indium Arsenide (GaInAs), Gallium Indium Phosphide (GaInP), and/or Gallium Indium Arsenide Phosphide (GaInAsP) or a combination thereof.

FIG. 2B illustrates a schematic diagram of composition structures of a substrate provided by the embodiments of the disclosure. As shown in FIG. 2B, the substrate 200 includes a first substrate sub-part 210, a second substrate sub-part 220, and a third substrate sub-part 230 sequentially connected in the first direction. The second substrate sub-part 220 sequentially has a first end face 120a and a second end face 120b which are arranged opposite to each other in the first direction. The first substrate sub-part 210 extends from the first end face 120a in a second direction. The first substrate sub-part 210 sequentially has a third end face 110a and a fourth end face 110b which are arranged opposite to each other in the first direction. The fourth end face 110b is connected to the first end face 120a. The third substrate sub-part 230 extends from the second end face 120b in a direction opposite to the second direction. The third substrate sub-part 230 sequentially has a fifth end face 130a and a sixth end face 130b which are arranged opposite to each other in the first direction. The fifth end face 130a is connected to the second end face 120b.

At S202, the first substrate sub-part, the second substrate sub-part, and the third substrate sub-part are respectively doped with ions, so as to form a source structure, a trench, and a drain structure.

Here, the first substrate sub-part, the second substrate sub-part, and the third substrate sub-part are respectively doped with ions according to the electrical requirements of the source structure, trench, and the drain structure, so as to form the source structure, the trench and, and the drain structure respectively corresponding to the first substrate sub-part, the second substrate sub-part, and the third substrate sub-part.

In some embodiments, the second substrate sub-part may be doped with second ions with a third concentration, so as to form the trench. Then, the first substrate sub-part and the third substrate sub-part are respectively doped with first ions with a first concentration, so as to form the source structure and the drain structure. During implementation, the first ions and the second ions may be doped by using any suitable ion doping process. No limits are made thereto in the embodiments of the disclosure. For example, the second ions may be implanted into the second substrate sub-part to form the trench, and the first ions may be respectively implanted into the first substrate sub-part and the third substrate sub-part to form the source structure and the drain structure in a diffusing mode.

In some embodiments, the first substrate sub-part, the second substrate sub-part, and the third substrate sub-part may be doped with second ions with a third concentration. Then, the first substrate sub-part and the third substrate sub-part may be doped with first ions with a first concentration, so as to form the source structure, the trench, and the drain structure respectively corresponding to the first substrate sub-part, the second substrate sub-part, and the third substrate sub-part.

At S203, a gate structure surrounding the trench and connected to the fourth end face and fifth end face is formed by depositing.

In some embodiments, the gate structure includes a gate insulating layer and a gate electrode. A first insulating material and a conductive material may be sequentially deposited on a surface of the trench, the fourth end face, and the fifth end face to respectively form a gate insulating layer and a gate electrode, that is, to form a gate structure. During implementation, the first insulating material may include, but is not limited to, at least one of aluminum oxide, silicon nitride, silicon dioxide, or the like. The conductive material may be at least one of a metal conductive material, a polysilicon material, or the like.

A process for depositing to form the gate insulating layer and/or gate electrode may include, but is not limited to, at least one of a Chemical Vapor Deposition (CVD) process, a Physical Vapor Deposition (PVD) process, an Atomic Layer Deposition (ALD) process, etc. No limits are made thereto in the embodiments of the disclosure.

In the embodiments of the disclosure, the second substrate sub-part sequentially has the first end face and the second end face which are arranged opposite to each other in the first direction, the first substrate sub-part extends from the first end face in the second direction, the first substrate sub-part sequentially has the third end face and the fourth end face which are arranged opposite to each other in the first direction, the fourth end face is connected to the first end face, the third substrate sub-part extends from the second end face in a direction opposite to the second direction, the third substrate sub-part sequentially has the fifth end face and the sixth end face which are arranged opposite to each other in the first direction, the fifth end face is connected to the second end face, and the source structure, the trench, and the drain structure are respectively formed by doping the first substrate sub-part, the second substrate sub-part, and the third substrate sub-part, so that the formed trench also sequentially has the first end face and the second end face which are arranged opposite to each other in the first direction, the source structure extends from the first end face in the second direction, the source structure sequentially has the third end face and the fourth end face which are arranged opposite to each other in the first direction, the fourth end face is connected to the first end face, the drain structure extends from the second end face in the direction opposite to the second direction, the drain structure sequentially has the fifth end face and the sixth end face which are arranged opposite to each other in the first direction, and the fifth end face is connected to the second end face. Thus, in an aspect, the trench sequentially has the first end face and the second end face which are arranged opposite to each other in the first direction, the source structure extends from the first end face in a second direction, and the drain structure extends from the second end face in the direction opposite to the second direction, so that the source structure, the trench, and the drain structure form a Z-like structure, and the gate structure surrounds the trench and is connected to the fourth end face of the source structure and the fifth end face of the drain structure; therefore, the morphology of the gate structure surrounding the trench can be conveniently controlled through the morphology of the fourth end face of the source structure and the morphology of the fifth end face of the drain structure; a connecting face of the gate structure and the fourth end face is aligned with the first end face of the trench; and a connecting face of the gate structure and the fifth end face is aligned with the second end face of the trench. In another aspect, the second direction intersects the first direction, so that the dimensions of the source structure and the gate structure in the first direction are reduced, and then the dimension of the transistor in the first direction can be further reduced. In yet another aspect, since the gate structure surrounds the trench, the control capability of the gate structure to the trench can be improved.

Figure 2C:
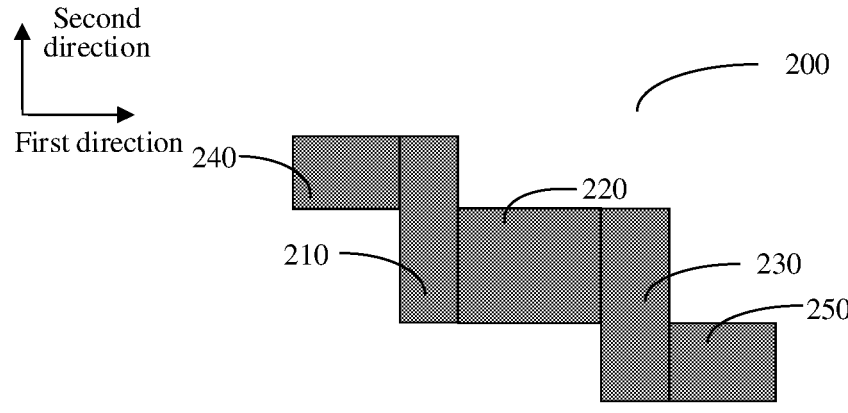
FIG. 2C illustrates a schematic diagram of composition structures of a substrate provided by the embodiments of the disclosure.
Figure 2D:
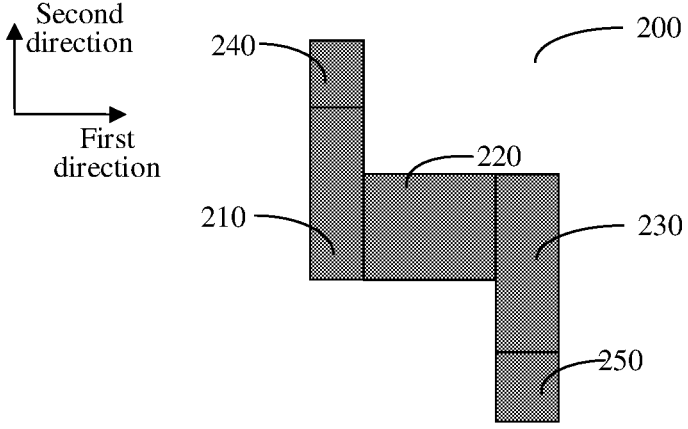
FIG. 2D illustrates a schematic diagram of composition structures of a substrate provided by the embodiments of the disclosure.

In some embodiments, as shown in FIG. 2C or FIG. 2D, the substrate 200 further includes a fourth substrate sub-part 240 connected to the first substrate sub-part 210, and a fifth substrate sub-part 250 connected to the third substrate sub-part 230. The above-mentioned S202 may include the following S211 to S212.

At S211, the second substrate sub-part is doped with second ions with a third concentration, so as to form the trench.

At S212, the first substrate sub-part and the third substrate sub-part are doped with first ions with a first concentration, so as to form the source structure and the drain structure. The first ions and the second ions have opposite polarities.

The above-mentioned method further includes the following S213.

At S213, the fourth substrate sub-part and the fifth substrate sub-part are doped with the first ions with a second concentration, so as to form a source extension structure and a drain extension structure. The second concentration is higher than the first concentration.

Here, the fourth substrate sub-part and the fifth substrate sub-part are doped with the first ions with the second concentration, so as to form the source extension structure and the drain extension structure respectively corresponding to the fourth substrate sub-part and the fifth substrate sub-part. Referring to FIG. 1E or FIG. 1F, the transistor 100 further includes the source expansion structure 150 connected to the source structure 110, and the drain expansion structure 160 connected to the drain structure 130. Both the source structure 110 and the drain structure 130 are doped with the first ions with the first concentration, and both the source extension structure 150 and the drain extension structure 160 are doped with the first ions with the second concentration. The trench 120 is doped with the second ions of the third concentration.

In some embodiments, as shown in FIG. 2C, the fourth substrate sub-part 240 and the first substrate sub-part 210 are sequentially connected in the first direction. The third substrate sub-part 230 and the fifth substrate sub-part 250 are sequentially connected in the first direction.

In some embodiments, as shown in FIG. 2D, the first substrate sub-part 210 and the fourth substrate sub-part 240 are sequentially connected in the second direction. The fifth substrate sub-part 250 and the third substrate sub-part 230 are sequentially connected in the second direction.

The embodiments of the disclosure provide a semiconductor structure. The semiconductor structure includes: the transistor described in any of the above-mentioned embodiments; and a storage structure connected to the source structure or the drain structure in the transistor.

During implementation, the storage structure may have any suitable shape, which includes, but is not limited to, one of a strip shape, a bent shape, an arc shape, a U shape, or the like. No limits are made thereto in the embodiments of the disclosure.

Figure 3A:
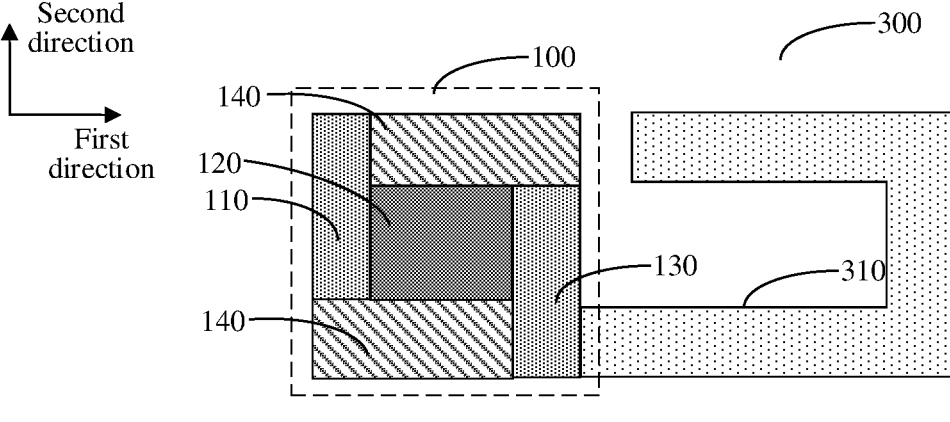
FIG. 3A illustrates a sectional view of a semiconductor structure in a plane where a first direction and a second direction are located provided by the embodiments of the disclosure.
Figure 3B:
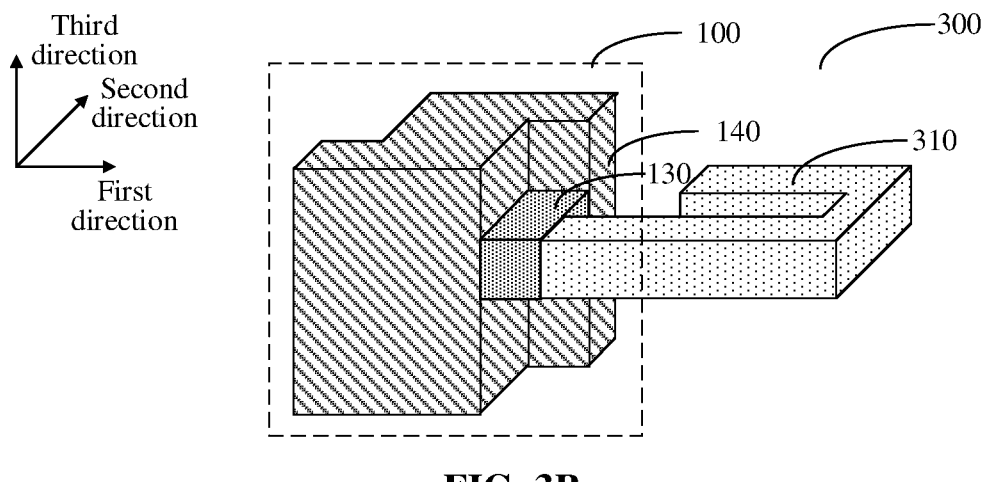
FIG. 3B illustrates a three-dimensional schematic diagram of the semiconductor structure in FIG. 3A provided by the embodiments of the disclosure.

In some embodiments, as shown in FIG. 3A and FIG. 3B, a semiconductor structure 300 includes: the transistor 100 described in any of the above-mentioned embodiments; and a storage structure 310 connected to a drain structure 130 in the transistor 100.

Figure 3C:
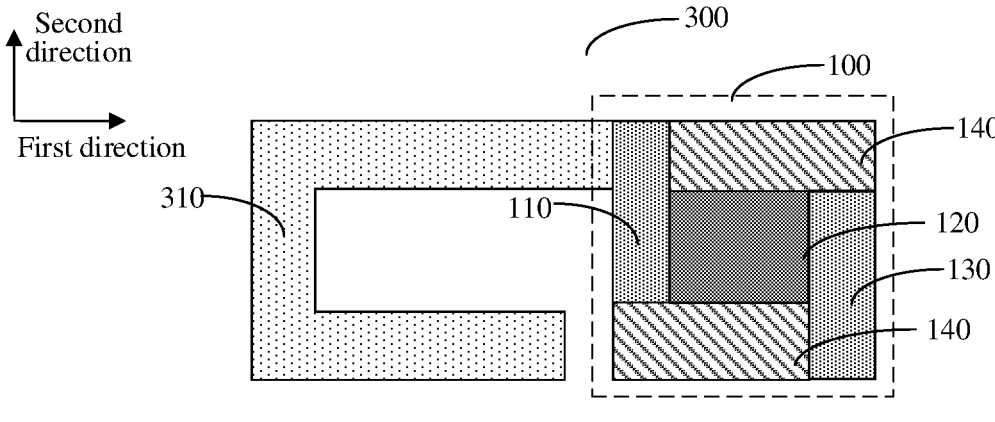
FIG. 3C illustrates a sectional view of a semiconductor structure in the plane where a first direction and a second direction are located provided by the embodiments of the disclosure.
Figure 3D:
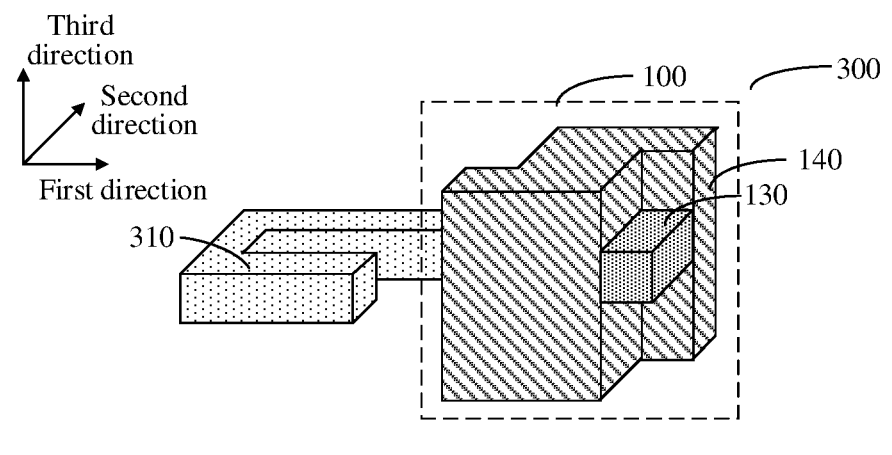
FIG. 3D illustrates a three-dimensional schematic diagram of the semiconductor structure in FIG. 3C provided by the embodiments of the disclosure.

In some embodiments, as shown in FIG. 3C and FIG. 3D, the semiconductor structure 300 includes: the transistor 100 described in any of the above-mentioned embodiments; and a storage structure 310 connected to a source structure 110 in the transistor 100.

In some embodiments, the storage structure may include a capacitor structure.

In some embodiments, the storage structure is directly connected to the source structure and/or the drain structure. Thus, the complexity of the semiconductor structure can be reduced, so as to simplify a process of forming the semiconductor structure.

In some embodiments, the storage structure is connected to the source structure through the source extension structure and/or a metal silicide structure; or, the storage structure is connected to the drain structure through the drain extension structure and/or the metal silicide structure. Here, the metal silicide structure may be formed by a metal silicide. During implementation, the substrate may be siliconized to obtain the metal silicide. By doing so, the contact resistance between the storage structure and the source structure can be reduced through the source extension structure and/or the metal silicide structure, and the contact resistance between the storage structure and the drain structure can be reduced through the drain extension structure and/or the metal silicide structure, so that the electrical performance of the semiconductor structure can be improved.

Figures 3E, 3F:
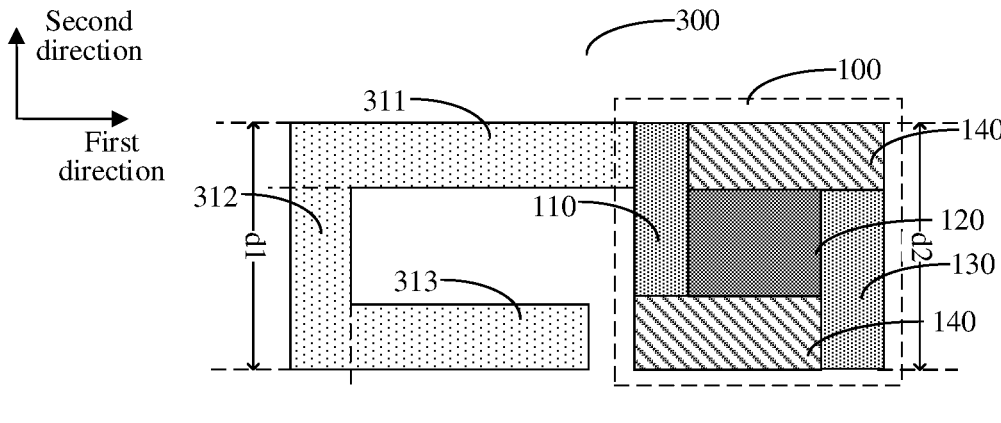
FIG. 3E illustrates a sectional view of a semiconductor structure in the plane where a first direction and a second direction are located provided by the embodiments of the disclosure.
FIG. 3F illustrates a sectional view of a semiconductor structure in the plane where a first direction and a second direction are located provided by the embodiments of the disclosure.

In some embodiments, as shown in FIG. 3E, the storage structure 310 includes a first storage sub-part 311, a second storage sub-part 312, and a third storage sub-part 313. The first storage sub-part 311 and the source structure 110 are sequentially connected in the first direction. The second storage sub-part 312 extends from one end, far away from the source structure 110, of the first storage sub-part 311 in the direction opposite to the second direction. The third storage sub-part 313 extends from one end, far away from the first storage sub-part 311, of the second storage sub-part 312 in the first direction. By doing so, the first storage sub-part, the second storage sub-part, and the third storage sub-part in the storage structure form a U-like structure, which can fully use the space in the second direction, so as to fully use the effective area of the semiconductor structure, thereby improving the integration degree of the semiconductor structure.

In some embodiments, as shown in FIG. 3F, the storage structure 310 includes the first storage sub-part 311, the second storage sub-part 312, and the third storage sub-part 313. The drain structure 130 and the first storage sub-part 311 are sequentially connected in the first direction. The second storage sub-part 312 extends from one end, far away from the drain structure 130, of the first storage sub-part 311 in the second direction. The third storage sub-part 313 extends from one end, far away from the first storage sub-part 311, of the second storage sub-part 312 in a direction opposite to the first direction. By doing so, the first storage sub-part, the second storage sub-part, and the third storage sub-part in the storage structure form a U-like structure, which can fully use the space in the second direction, so as to fully use the effective area of the semiconductor structure, thereby improving the integration degree of the semiconductor structure.

In some embodiments, referring to FIG. 3E or FIG. 3F, in the second direction, the maximum dimension d1 of the storage structure 310 is the same as the maximum dimension d2 of the transistor 100. Thus, the space in the second direction can be used more fully, so as to more fully use the effective area of the semiconductor structure, thereby further improving the integration degree of the semiconductor structure.

Figure 3G:
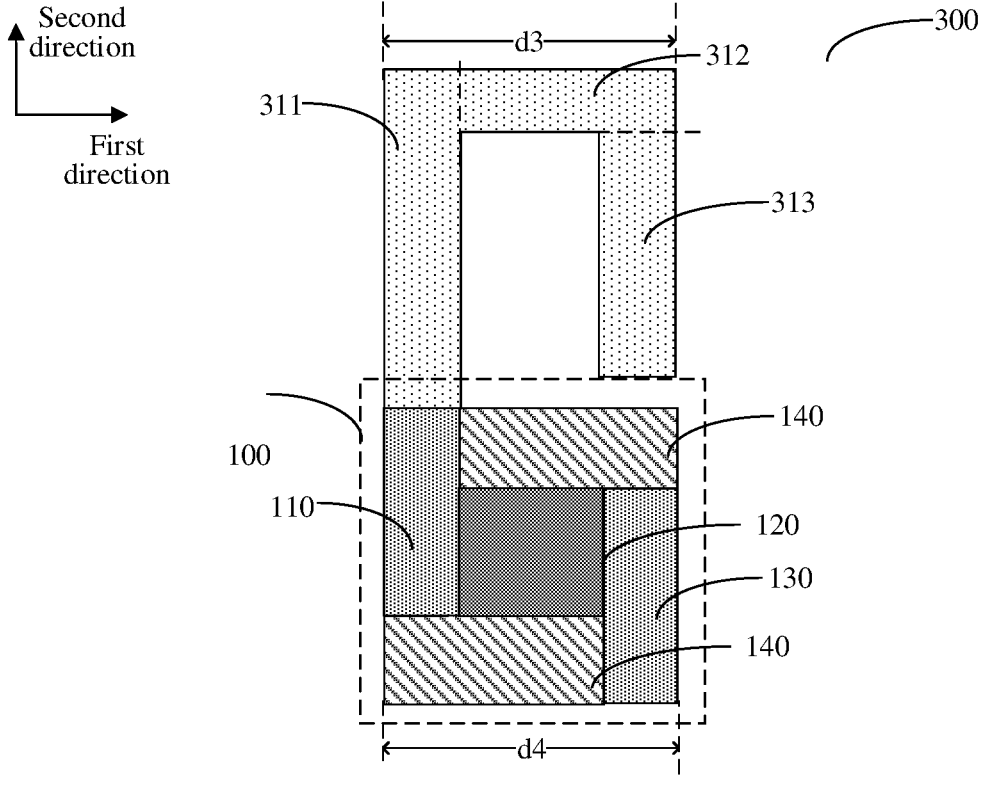
FIG. 3G illustrates a sectional view of a semiconductor structure in the plane where a first direction and a second direction are located provided by the embodiments of the disclosure.

In some embodiments, as shown in FIG. 3G, the storage structure 310 includes the first storage sub-part 311, the second storage sub-part 312, and the third storage sub-part 313. The source structure 110 and the first storage sub-part 311 are sequentially connected in the second direction. The second storage sub-part 312 extends from one end, far away from the source structure 110, of the first storage sub-part 311 in the first direction. The third storage sub-part 313 extends from one end, far away from the first storage sub-part 311, of the second storage sub-part 312 in the direction opposite to the second direction. By doing so, the first storage sub-part, the second storage sub-part, and the third storage sub-part in the storage structure form a U-like structure, which can fully use the space in the first direction, so as to fully use the effective area of the semiconductor structure, thereby improving the integration degree of the semiconductor structure.

Figure 3H:
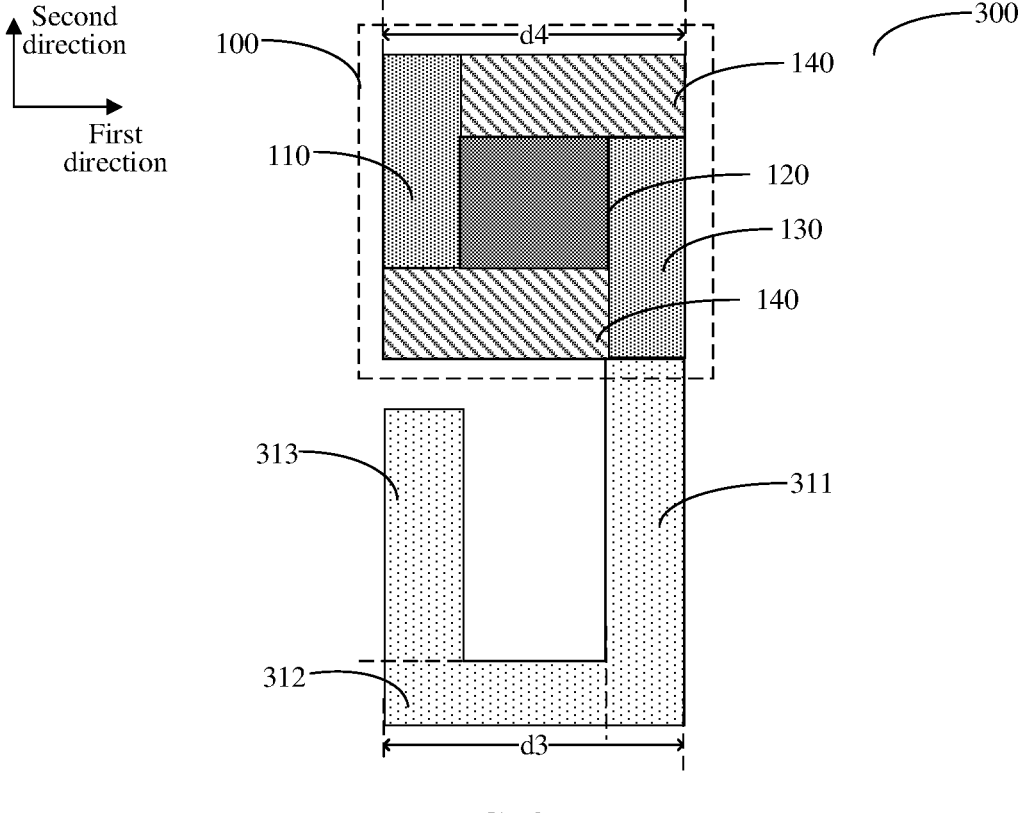
FIG. 3H illustrates a sectional view of a semiconductor structure in the plane where a first direction and a second direction are located provided by the embodiments of the disclosure.

In some embodiments, as shown in FIG. 3H, the storage structure 310 includes a first storage sub-part 311, a second storage sub-part 312, and a third storage sub-part 313. The first storage sub-part 311 and the drain structure 130 are sequentially connected in the second direction. The second storage sub-part 312 extends from the end, far away from the drain structure 130, of the first storage sub-part 311 in the direction opposite to the first direction. The third storage sub-part 313 extends from one end, away from the first storage sub-part 311, of the second storage sub-part 312 in the second direction. By doing so, the first storage sub-part, the second storage sub-part, and the third storage sub-part in the storage structure form a U-like structure, which can fully use the space in the first direction, so as to fully use the effective area of the semiconductor structure, thereby improving the integration degree of the semiconductor structure.

In some embodiments, referring to FIG. 3G or FIG. 3H, in the first direction, the maximum dimension d3 of the storage structure 310 is the same as the maximum dimension d4 of the transistor 100. Thus, the space in the first direction can be used more fully, so as to more fully use the effective area of the semiconductor structure, thereby further improving the integration degree of the semiconductor structure.

The embodiments of the disclosure provide a method for forming a semiconductor structure, as shown in FIG. 4A, the method includes the following S401 to S404.

At S401, a substrate is provided. The substrate includes a first substrate sub-part, a second substrate sub-part, and a third substrate sub-part sequentially connected in a first direction, and a sixth substrate sub-part connected to the first substrate sub-part or the third substrate sub-part. The second substrate sub-part sequentially has a first end face and a second end face which are arranged opposite to each other in the first direction. The first substrate sub-part extends from the first end face in a second direction. The first substrate sub-part sequentially has a third end face and a fourth end face which are arranged opposite to each other in the first direction. The fourth end face is connected to the first end face. The third substrate sub-part extends from the second end face in a direction opposite to the second direction. The third substrate sub-part sequentially has a fifth end face and a sixth end face which are arranged opposite to each other in the first direction. The fifth end face is connected to the second end face. The second direction intersects the first direction.

At S402, the first substrate sub-part, the second substrate sub-part, the third substrate sub-part, and the sixth substrate sub-part are respectively doped with ions, so as to form a source structure, a trench, a drain structure, and a storage contract structure.

Here, the storage contract structure is a conductive contract structure for connecting the storage structure and the source structure or the drain structure. During implementation, the first substrate sub-part, the second substrate sub-part, the third substrate sub-part, and the sixth substrate sub-part may be doped with ions by using any suitable ion doping process according to the electrical requirements of the source structure, the trench, the drain structure, and the storage contact structure, so as to form the source structure, the trench, the drain structure, and the storage contact structure respectively corresponding to the first substrate sub-part, the second substrate sub-part, the third substrate sub-part, and the sixth substrate sub-part.

In some embodiments, the second substrate sub-part may be doped with second ions with a third concentration, so as to form the trench. Then, the first substrate sub-part, the third substrate sub-part, and the sixth substrate sub-part are respectively doped with first ions with a first concentration, so as to form the source structure, the drain structure, and the storage contract structure. During implementation, the first ions and the second ions may be doped by using any suitable ion doping process. No limits are made thereto in the embodiments of the disclosure. For example, second ions may be implanted into the second substrate sub-part, and first ions are implanted into the first substrate sub-part, the third substrate sub-part, and the sixth substrate sub-part respectively to form the source structure, the drain structure, and the storage contact structure in a diffusing mode.

In some embodiments, the first substrate sub-part, the second substrate sub-part, the third substrate sub-part, and the sixth substrate sub-part may all be doped with the second ions with the third concentration. Then, the first substrate sub-part, the third substrate sub-part, and the sixth substrate sub-part are doped with the first ions with the first concentration, so as to form the source structure, the trench, the drain structure, and the storage contact structure respectively corresponding to the first substrate sub-part, the second substrate sub-part, the third substrate sub-part, and the sixth substrate sub-part.

At S403, a gate structure surrounding the trench and connected to the fourth end face and fifth end face is formed by depositing.

At S404, a first electrode layer, a dielectric layer, and a second electrode layer are sequentially deposited on a surface of the storage contact structure, so as to form the storage structure.

Here, a first conductive material may be deposited on a surface of the storage contact structure to form the first electrode layer covering the surface of the storage contact structure; then, a dielectric material may be deposited on a surface of the first electrode layer to form the dielectric layer covering the surface of the first electrode layer; and then, a second conductive material may be deposited on a surface of the dielectric layer to form a second electrode layer covering the dielectric layer. The first electrode layer, the dielectric layer, and the second electrode layer may together form the storage structure. During implementation, both the first conductive material and the second conductive material may include, but are not limited to, metal nitrides and/or metal silicides, such as titanium nitride (TiN); and the dielectric material may include, but is not limited to, a high K dielectric material, such as at least one of lanthanum oxide ($La_2O_3$), aluminum oxide ($Al_2O_3$), hafnium oxide ($HfO_2$), hafnium oxynitride (HfON), hafnium silicate (HfSiOx), or zirconia ($ZrO_2$). In some embodiments, the first conductive material and the second conductive material may also include polysilicon.

Figure 4B:
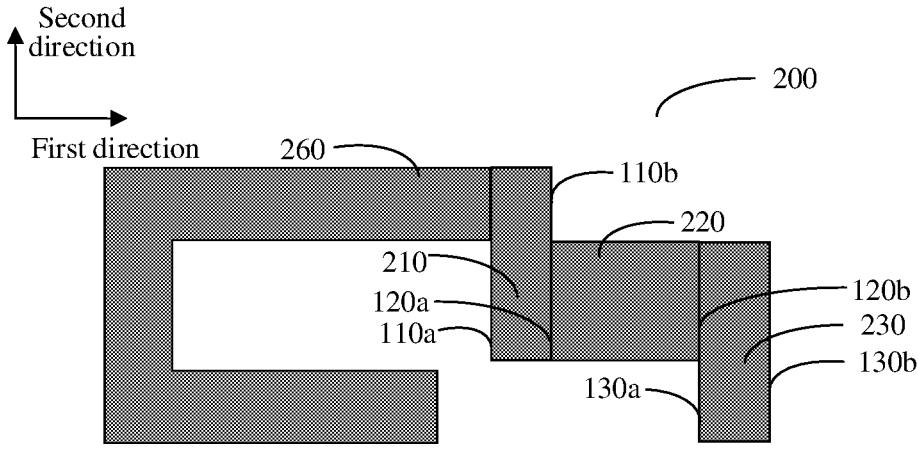
FIG. 4B illustrates a schematic diagram of composition structures of a substrate provided by the embodiments of the disclosure.
Figure 4C:
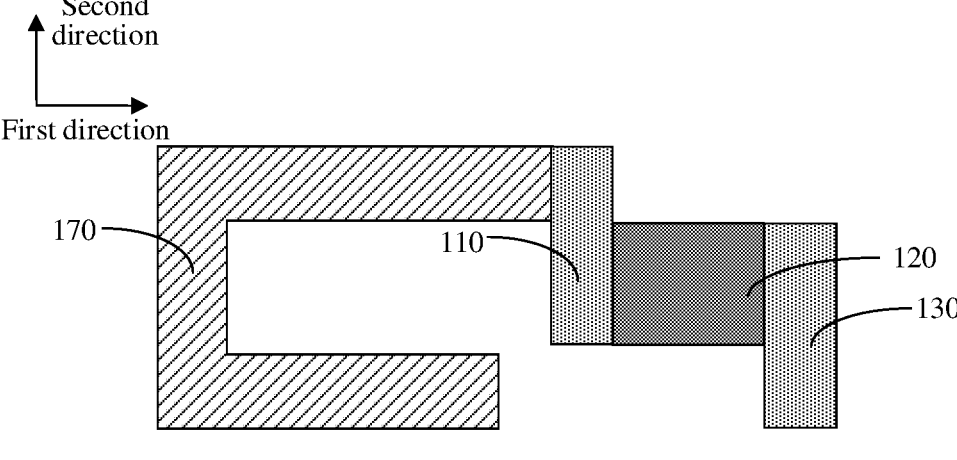
FIG. 4C illustrates a schematic diagram of forming a source structure, a trench, a drain structure, and a storage contact structure in a method for forming a semiconductor structure provided by the embodiments of the disclosure.
Figure 4D:
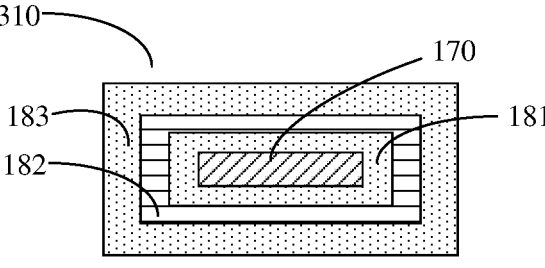
FIG. 4D illustrates a sectional view of a storage structure provided by the embodiments of the disclosure.

FIG. 4B illustrates a schematic diagram of composition structures of a substrate provided by the embodiments of the disclosure. As shown in FIG. 4B, the substrate 200 includes a first substrate sub-part 210, a second substrate sub-part 220, and a third substrate sub-part 230 sequentially connected in a first direction, and a sixth substrate sub-part 260 connected to the first substrate sub-part 210. The second substrate sub-part 220 sequentially has a first end face 120a and a second end face 120b which are arranged opposite to each other in the first direction. The first substrate sub-part 210 extends from the first end face 120a in a second direction. The first substrate sub-part 210 sequentially has a third end face 110a and a fourth end face 110b which are arranged opposite to each other in the first direction. The fourth end face 110b is connected to the first end face 120a. The third substrate sub-part 230 extends from the second end face 120b in a direction opposite to the second direction. The third substrate sub-part 230 sequentially has a fifth end face 130a and a sixth end face 130b which are arranged opposite to each other in the first direction. The fifth end face 130a is connected to the second end face 120b. The first substrate sub-part 210, the second substrate sub-part 220, the third substrate sub-part 230, and the sixth substrate sub-part 260 are respectively doped with ions, which can form a source structure 110, a trench 120, a drain structure 130, and a storage contract structure 170 as shown in FIG. 4C. Then, a gate structure 140 may be formed by depositing, and a first electrode layer, a dielectric layer, and a second electrode layer are sequentially deposited on a surface of the storage contact structure 170, so as to form the storage structure 310 as shown in FIG. 3C. FIG. 4D illustrates a sectional view of a storage structure provided by the embodiments of the disclosure. As shown in FIG. 4D, the storage structure 310 includes a first electrode layer 181, a dielectric layer 182, and a second electrode layer 183 sequentially deposited on the surface of the storage contract structure 170.

Figure 4E:
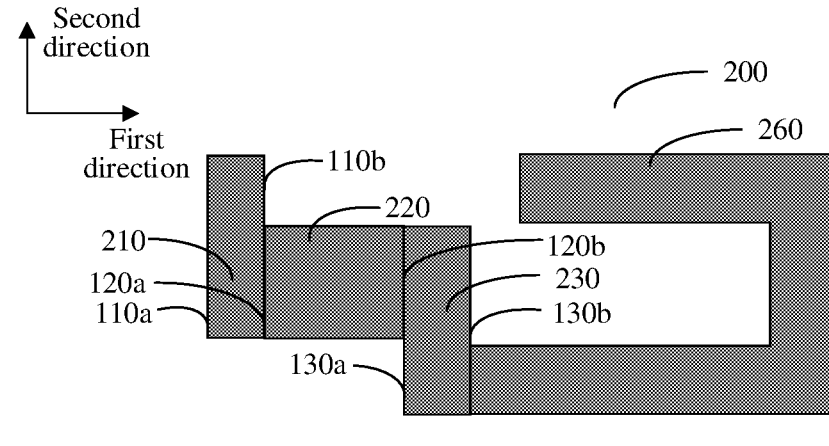
FIG. 4E illustrates a schematic diagram of composition structures of a substrate provided by the embodiments of the disclosure.
Figure 4F:
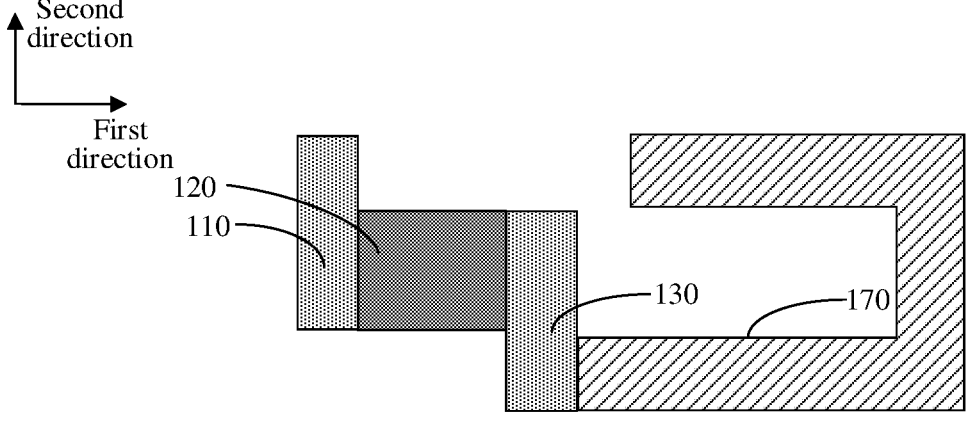
FIG. 4F illustrates a schematic diagram of a source structure, a trench, a drain structure, and a storage contact structure formed in a method for forming a semiconductor structure provided by the embodiments of the disclosure.

FIG. 4E illustrates a schematic diagram of composition structures of a substrate provided by the embodiments of the disclosure. As shown in FIG. 4E, the substrate 200 includes a first substrate sub-part 210, a second substrate sub-part 220, and a third substrate sub-part 230 sequentially connected in a first direction, and a sixth substrate sub-part 260 connected to the third substrate sub-part 230. The second substrate sub-part 220 sequentially has a first end face 120a and a second end face 120b which are arranged opposite to each other in the first direction. The first substrate sub-part 210 extends from the first end face 120a in a second direction. The first substrate sub-part 210 sequentially has a third end face 110a and a fourth end face 110b which are arranged opposite to each other in the first direction. The fourth end face 110b is connected to the first end face 120a. The third substrate sub-part 230 extends from the second end face 120b in a direction opposite to the second direction. The third substrate sub-part 230 sequentially has a fifth end face 130a and a sixth end face 130b which are arranged opposite to each other in the first direction. The fifth end face 130a is connected to the second end face 120b. The first substrate sub-part 210, the second substrate sub-part 220, the third substrate sub-part 230, and the sixth substrate sub-part 260 are respectively doped with ions, which can form a source structure 110, a trench 120, a drain structure 130, and a storage contract structure 170 as shown in FIG. 4F. Then, a gate structure 140 may be formed by depositing, and a first electrode layer, to dielectric layer, and a second electrode layer are sequentially deposited on a surface of the storage contract structure 170, so as to form the storage structure 310 as shown in FIG. 3A.

The embodiments of the disclosure provide a memory. The memory includes: a plurality of semiconductor structures as described in the above-mentioned embodiments arranged in an array, a plurality of word lines, and a plurality of bit lines. The plurality of semiconductor structures arranged in an array include a plurality of columns of the semiconductor structures arranged in a first direction or a second direction. Each column of the semiconductor structures includes a plurality of semiconductor structures arranged in a third direction. Each of the word lines is connected to gate structures of the transistors in a column of semiconductor structures. Each of the bit lines is connected to either the source structures or the drain structures, not connected to the storage structures, of a row of semiconductor structures arranged in the first direction or the second direction. The third direction intersects both the first direction and the second direction.

In some embodiments, in a case that the plurality of columns of semiconductor structures are arranged in the first direction, each bit line is connected to either the source structures or the drain structures, not connected to the storage structures, of transistors in a row of semiconductor structures arranged in the first direction. In a case that a plurality of columns of semiconductor structures are arranged in the second direction, each bit line is connected to either the source structures or the drain structures, not connected to the storage structures, of transistors in a row of semiconductor structures arranged in the second direction.

Figure 5A:
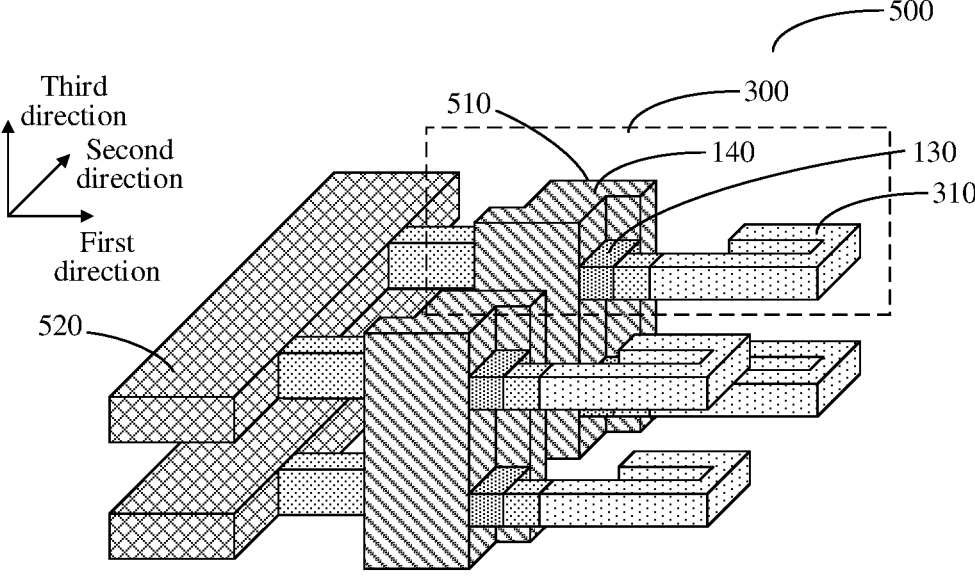
FIG. 5A illustrates a schematic diagram of composition structures of a memory provided by the embodiments of the disclosure.

In some embodiments, as shown in FIG. 5A, the memory 500 includes: a plurality of semiconductor structures 300 arranged in an array, a plurality of word lines 510, and a plurality of bit lines 520. The plurality of semiconductor structures 300 arranged in an array include the semiconductor structures 300 arranged in a second direction. Each column of semiconductor structures 300 include the plurality of semiconductor structures 300 arranged in a third direction. The drain structure 130 of the transistor of each semiconductor structure 300 is connected to the storage structure 310. Each of the word lines 510 is connected to a gate structure 140 of the transistor in a column of semiconductor structures 300. Each of the bit lines is connected to the source structures of the transistors of a row of semiconductor structures 300 arranged in the second direction. During implementation, the storage structure and the drain structure may be connected with each other directly or may be connected with each other through an intermediate structure. No limits are made thereto in the embodiments of the disclosure.

Figure 5B:
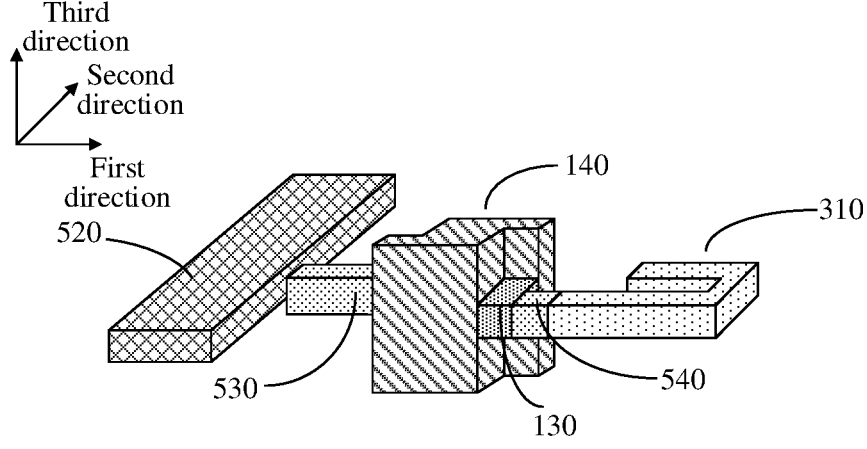
FIG. 5B illustrates a sectional view of a semiconductor structure in a memory in a plane where a first direction and a second direction are located provided by the embodiments of the disclosure.
Figure 5C:
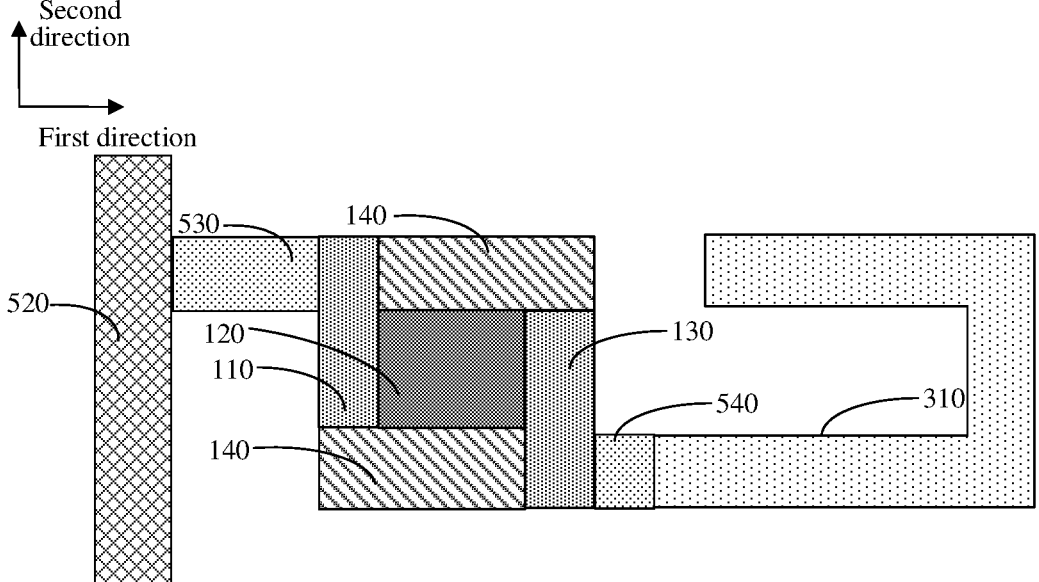
FIG. 5C illustrates a three-dimensional schematic diagram of the semiconductor structure in FIG. 5B provided by the embodiments of the disclosure.

In some embodiments, as shown in FIG. 5B and FIG. 5C, each semiconductor structure in the memory includes: a source contact structure 530, a source structure 110, a trench 120, a drain structure 130, a drain contact structure 540, and a storage structure 310 that are sequentially connected in a first direction, and a gate structure 140 surrounding the trench 120. The source contact structure 530 and the drain structure 110 are sequentially connected in the first direction. The source structure 110 is connected with the bit line 520 through the source contact structure 530. The drain structure 130, the drain contact structure 540, and the storage structure 310 are sequentially connected in the first direction. During implementation, the source contact structure may include a source extension structure and/or a metal silicide structure. The drain structure may include a drain extension structure and/or a metal silicide structure.

Figure 5D:
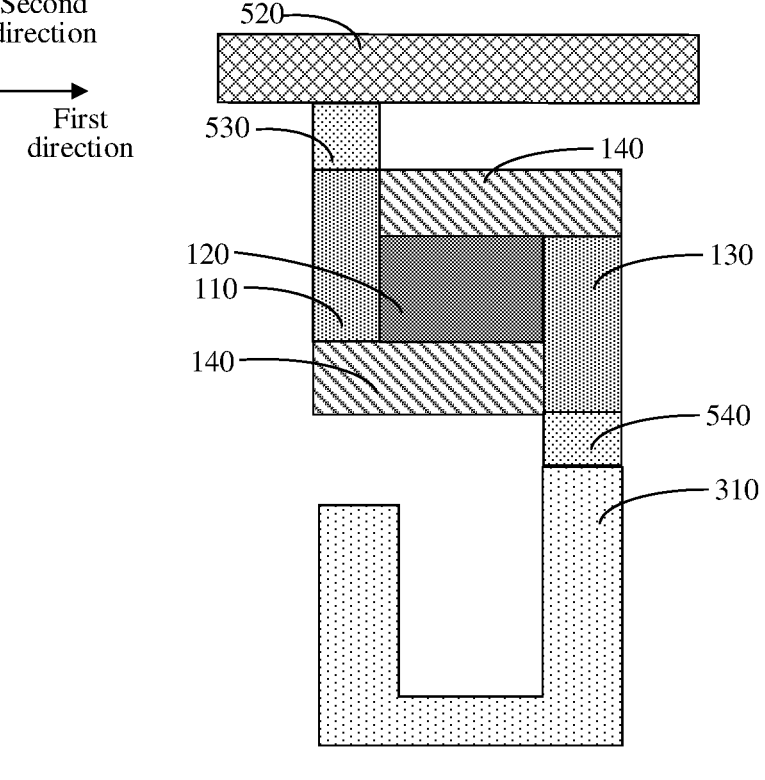
FIG. 5D illustrates a sectional view of a semiconductor structure in a memory in the plane where a first direction and a second direction are located provided by the embodiments of the disclosure.

In some embodiments, as shown in FIG. 5D, each semiconductor structure in the memory includes: a source contact structure 530, a source structure 110, a trench 120, a drain structure 130, a drain contact structure 540, and a storage structure 310 that are sequentially connected in a first direction, and a gate structure 140 surrounding the trench 120. The drain structure 110 and the source contact structure 530 are sequentially connected in the second direction. The source structure 110 is connected with the bit line 520 through the source contact structure 530. The storage structure 310, the drain contact structure 540, and the drain structure 130 are sequentially connected in the second direction.

The embodiments of the disclosure provide a method for forming a memory, as shown in FIG. 6A, the method includes the following S601 to S605.

At S601, a plurality of columns of substrates arranged in a first direction or a second direction are provided. Each column of the substrates includes the substrates arranged in a third direction. The first direction, the second direction, and the third direction intersect each other. The substrate includes a first substrate sub-part, a second substrate sub-part, and a third substrate sub-part sequentially connected in the first direction, and a sixth substrate sub-part connected to the first substrate sub-part or the third substrate sub-part. The second substrate sub-part sequentially has a first end face and a second end face which are arranged opposite to each other in the first direction. The first substrate sub-part extends from the first end face in the second direction. The first substrate sub-part sequentially has a third end face and a fourth end face which are arranged opposite to each other in the first direction. The fourth end face is connected to the first end face. The third substrate sub-part extends from the second end face in a direction opposite to the second direction. The third substrate sub-part sequentially has a fifth end face and a sixth end face which are arranged opposite to each other in the first direction. The fifth end face is connected to the second end face.

During implementation, in a case that a plurality of columns of substrates are arranged in the first direction, the sixth substrate sub-part and the third substrate sub-part may be sequentially connected in the second direction, or the first substrate sub-part and the sixth substrate sub-part may be sequentially connected in the second direction. In a case that a plurality of columns of substrates are arranged in the second direction, the third substrate sub-part, and the sixth substrate sub-part may be sequentially connected in the first direction, or the sixth substrate sub-part and the first substrate sub-part may be sequentially connected in the first direction.

Figure 6B:
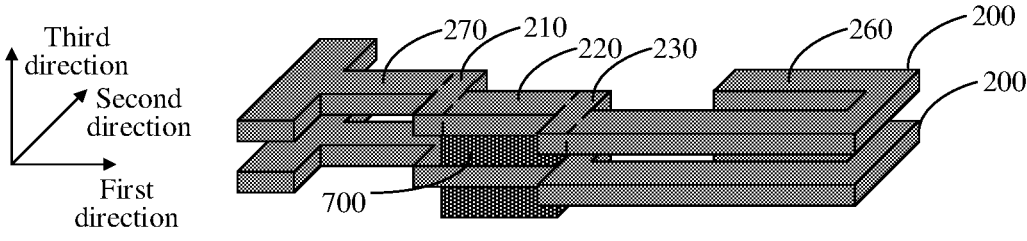
FIG. 6B illustrates a schematic composition structural diagram of one column of a plurality of columns of substrates arranged in a second direction provided by the embodiments of the disclosure.

Taking the case that the plurality of columns of the substrates are arranged in the second direction, and the third substrate sub-part and the sixth substrate sub-part are sequentially connected in the first direction as an example, FIG. 6B illustrates a schematic composition structural diagram of one column of a plurality of columns of substrates arranged in a second direction provided by the embodiments of the disclosure. In the case that the plurality of columns of the substrates are arranged in the second direction, as shown in FIG. 6B, each column of the substrates 200 include the substrates 200 arranged in a third direction. Each substrate 200 includes a first substrate sub-part 210, a second substrate sub-part 220, and a third substrate sub-part 230 sequentially connected in the first direction, and a sixth substrate sub-part 260 connected to the third substrate sub-part 230. The second substrate sub-part 220 sequentially has a first end face and a second end face which are arranged opposite to each other in the first direction. The first substrate sub-part 210 extends from the first end face in the second direction. The first substrate sub-part 210 sequentially has a third end face and a fourth end face which are arranged opposite to each other in the first direction. The fourth end face is connected to the first end face. The third substrate sub-part 230 extends from the second end face in a direction opposite to the second direction. The third substrate sub-part 230 sequentially has a fifth end face and a sixth end face which are arranged opposite to each other in the first direction. The fifth end face is connected to the second end face. The third substrate sub-part 230 and the sixth substrate sub-part 260 are sequentially connected in the first direction.

In some embodiments, continuously referring to FIG. 6B, the substrates 200 in the same column may be supported by a sacrificial layer 700, so that the substrates 200 in the same column are distributed at interval in the third direction. During implementation, the material of the sacrificial layer and the material of the substrates may have high etching selectivity. Thus, sacrificial layers can be removed by etching in a subsequent process. For example, the material used for the substrate may include, but is not limited to, silicon, and the material used for the sacrificial layer may include, but not limited to, silicon germanium alloy.

At S602, the first substrate sub-part, the second substrate sub-part, the third substrate sub-part, and the sixth substrate sub-part of the substrate are doped with ions, so as to form a source structure, a trench, a drain structure, and a storage contact structure respectively corresponding to the first substrate sub-part, the second substrate sub-part, the third substrate sub-part, and the sixth substrate sub-part.

Figure 6C:
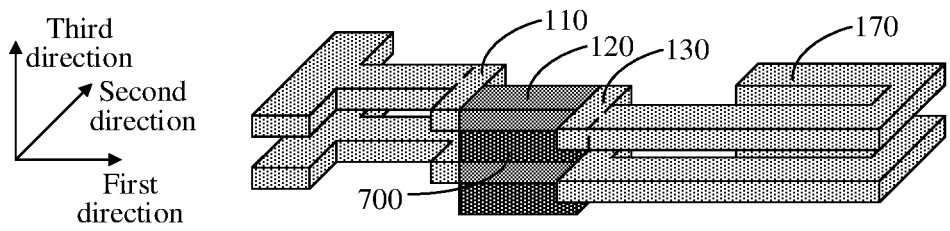
FIG. 6C illustrates a schematic structural diagram of a source structure, a trench, a drain structure, and a storage contact structure formed in a method for forming a memory provided by the embodiments of the disclosure.

FIG. 6C illustrates a schematic structural diagram of a source structure, a trench, a drain structure, and a storage contact structure formed in a method for forming a memory provided by the embodiments of the disclosure. Referring to FIG. 6B and FIG. 6C, the first substrate sub-part 210, the second substrate sub-part 220, the third substrate sub-part 230, and the sixth substrate sub-part 260 in each of the substrates 200 are doped with ions, so as to form the source structure 110, the trench 120, the drain structure 130, and the storage contact structure 170 respectively corresponding to the first substrate sub-part 210, the second substrate sub-part 220, the third substrate sub-part 230, and the sixth substrate sub-part 260.

At S603, gate structures are formed on the doped substrates by depositing and word lines, each of which is connected to the gate structures of a column of substrates are formed. Each gate structure surrounds the trench in the substrate, and is connected to the fourth end face and the fifth end face in the substrate.

At S604, a first electrode layer, a dielectric layer, and a second electrode layer are sequentially deposited on a surface of the storage contact structure, so as to form a storage structure.

At S605, a plurality of bit lines are formed. Each of the bit lines is connected to either the source structures or the drain structures, not connected to the storage structures, of a row of substrates arranged in the first direction or the second direction.

Here, in a case that the source structure of each substrate is connected to the storage structure; each bit line is connected to drain structures of the substrates in the same row. In a case that the drain structure of each substrate is connected to the storage structure, each bit line is connected to source structures in the substrate in the same row.

In a case that the plurality of columns of substrates are arranged in the first direction, each bit line is connected to either the source structures or the drain structures, not connected to the storage structures, of a row of substrates arranged in the first direction. In a case that the plurality of columns of substrates are arranged in the second direction, each bit line is connected to either the source structures or the drain structures, not connected to the storage structures, of a row of substrates arranged in the second direction.

It is to be noted that the above-mentioned S604 and the S605 are not limited to the execution order as described in FIG. 6A during implementation. For example, S605 may be executed after t S604, or S604 may be executed after S605. No limits are limited thereto in the embodiments of the disclosure.

In some embodiments, the above-mentioned S601 may include the following S611 to S612.

At S611, a base is provided. The base includes at least one stack structure arranged in the first direction or the second direction. The stack structure includes a plurality of sacrificial layers and a plurality of substrate layers alternately stacked in the third direction. The stack structure includes a first stack sub-part, a second stack sub-part, and a third stack sub-part sequentially connected in the first direction, and a fourth stack sub-part connected to the first stack sub-part or the third stack sub-part. The second stack sub-part sequentially has a seventh end face and an eighth end face which are arranged opposite to each other in the first direction. The first stack sub-part extends from the seventh end face in the second direction. The third stack sub-part extends from the eighth end face in the direction opposite to the second direction.

At S612, the sacrificial layers located at the first stack sub-part, the third stack sub-part, and the fourth stack sub-part of the stack structure are removed etching. The substrate layer in the first stack sub-part is taken as the first substrate sub-part. The substrate layer in the third stack sub-part is taken as the third substrate sub-part. The substrate layer in the fourth stack sub-part is taken as the sixth substrate sub-part. The substrate layer in the second stack sub-part is taken as the second substrate sub-part.

Here, stack structures in the base re etched separately, and each stack structure forms a column of the substrates.

Figure 6D:
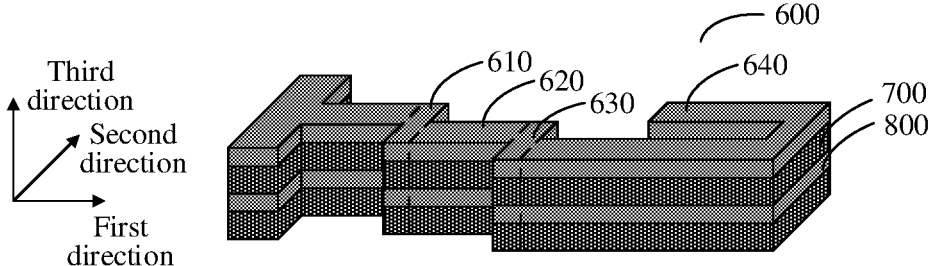
FIG. 6D illustrates a schematic composition structural diagram of a stack structure provided by the embodiments of the disclosure.

FIG. 6D illustrates a schematic composition structural diagram of a stack structure provided by the embodiments of the disclosure. As shown in FIG. 6D, a stack structure 600 includes a plurality of sacrificial layers 700 and a plurality of substrate layers 800 alternately stacked in the third direction. The stack structure 600 includes a first stack sub-part 610, a second stack sub-part 620, and a third stack sub-part 630 sequentially connected in the first direction, and a fourth stack sub-part 640 connected to the third stack sub-part 630. The second stack sub-part 620 sequentially has a seventh end face and an eighth end face which are arranged opposite to each other in the first direction. The first stack sub-part 610 extends from the seventh end face in the second direction. The third stack sub-part 630 extends from the eighth end face in a direction opposite to the second direction. Then, referring to FIG. 6D and FIG. 6B, after the sacrificial layers located at the first stack sub-part 610, the third stack sub-part 630, and the fourth stack sub-part 640 of the stack structure 600 are removed by etching, substrate layers in the first stack sub-part 610 may be taken as the first substrate sub-part 210, each substrate layer in the third stack sub-part 630 may be taken as the third substrate sub-part 230, each substrate layer in the fourth stack sub-part 640 may be taken as the sixth substrate sub-part 260, and each substrate layer in the second stack sub-part 620 may be taken as the second substrate sub-part 220.

In some embodiments, the fourth stack sub-part may also be connected to the first stack sub-part.

In some embodiments, the second stack sub-part sequentially has a ninth end face and a tenth end face arranged opposite to each other in the second direction. The S612 that the sacrificial layers located at the first stack sub-part, the third stack sub-part, and the fourth stack sub-part of the stack structure are removed by etching may include the following S621 to S622.

At S621, the sacrificial layers in the stack structure are etched in the second direction by taking a plane where the ninth end face is located as an etching stop surface and in the direction opposite to the second direction by taking a plane where the tenth end face is located as an etching stop surface, so as to remove part of the sacrificial layers located at the first stack sub-part, the third stack sub-part, and the fourth stack sub-part.

At S622, after part of the sacrificial layers are removed, the sacrificial layers in the stack structure are etched in the first direction by taking a plane where the seventh end face is located as an etching stop surface and in a direction opposite to the first direction by taking a plane where the eighth end face is located as an etching stop surface, so as to remove the remaining sacrificial layers located at the first stack sub-part, the third stack sub-part, and the fourth stack sub-part.

Figure 6E:
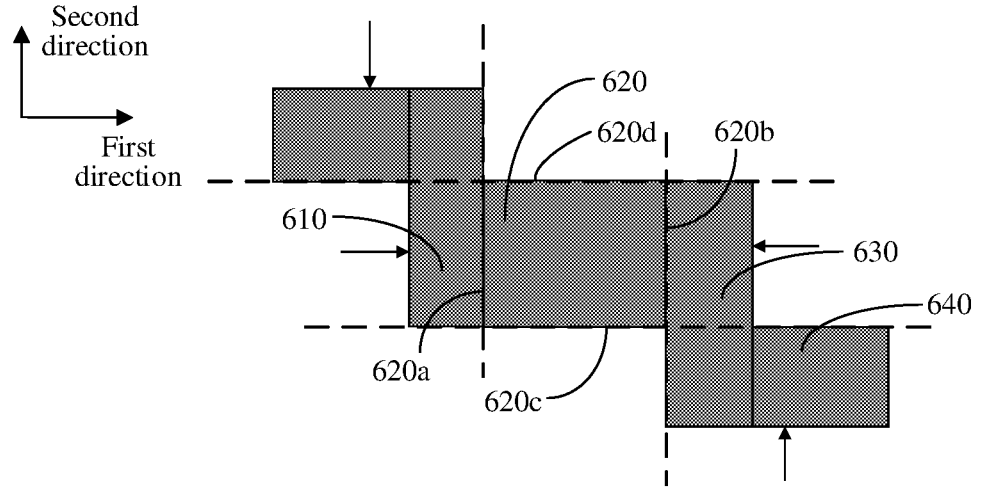
FIG. 6E illustrates a vertical view of a stack structure in a direction opposite to a third direction in a method for forming a memory provided by the embodiments of the disclosure.

FIG. 6E illustrates a vertical view of a stack structure in a direction opposite to a third direction in a method for forming a memory provided by the embodiments of the disclosure. As shown in FIG. 6E, the sacrificial layers in the stack structure 600 may be etched in the second direction by taking a plane where the ninth end face 620*c* is located as an etching stop surface and in a direction opposite to the second direction by taking a plane where the tenth end face 620*d* is located as an etching stop surface, so as to remove part of the sacrificial layers located at the first stack sub-part 610, the third stack sub-part 630, and the fourth stack sub-part 640. Then, after the part of the sacrificial layers are removed, the sacrificial layers in the stack structure 600 may be etched in the first direction by taking a plane where the seventh end face 620*a* is located as an etching stop surface and in a direction opposite to the first direction by taking a plane where the eighth end face 620*b* is located as an etching stop surface, so as to remove the remaining sacrificial layers located at the first stack sub-part 610, the third stack sub-part 630, and the fourth stack sub-part 640.

In the above-mentioned embodiments, the plane where the ninth end face is located is taken as an etching stop surface in the second direction, the plane where the tenth end face is located is taken as an etching stop surface in the direction opposite to the second direction, the plane where the seventh end face is located is taken as an etching stop surface in the first direction, and the plane where the eighth end face is located is taken as an etching stop surface in the direction opposite to the first direction. By doing so, the sacrificial layers located in the first stack sub-part, the third stack sub-part, and the fourth stack sub-part can be etched more precisely, so as to control the morphology of gate structures by the seventh end face, the eighth end face, the ninth end face, and the tenth end face more accurately in subsequent processes.

In some embodiments, S603 may include the following S631 to S634.

At S631, a first filling layer is deposited in gaps among first substrate sub-parts, in gaps among third substrate sub-parts, and in gaps among sixth substrate sub-parts in the stack structure, so as to form two gate sub-trenches respectively located on both sides of the second stack sub-part in the second direction.

During implementation, the material used to forming the first filling layer by depositing may be determined according to actual situations. No limits are made thereto in the embodiments of the disclosure. For example, the first filling layer may be formed by depositing by using the materials, such as an oxide.

At S632, the sacrificial layers located at the second stack sub-part are removed by etching, so as to communicate the two gate sub-trenches located on both sides of the second stack sub-part and form a gate reserved area.

Here, for each stack structure, the sacrificial layers located at the second stack sub-part of the stack structure are removed by etching, so as to communicate the two gate sub-trenches located on both sides of the second stack sub-part and form the gate reserved area.

At S633, gate structures are deposited and formed in the gate reserved area by a self-aligned process. A column of gate structures formed in the same stack structure are sequentially connected in the third direction.

Here, the gate structures can be deposited and formed in each gate reserved area by the self-aligned process, a connecting face of the formed gate structure and the fourth end face of the source structure can be aligned with the first end face of the trench, and a connecting face of the gate structure and fifth end face of the drain structure can be aligned with the second end face of the trench, so that the morphology of the gate structure can be controlled more accurately.

At S634, the word lines, each of which is connected to a column of gate structures, are formed.

In some embodiments, since gate structures arranged in a column in the same stack structure are sequentially connected in the third direction, the gate structures arranged in a column sequentially connected in the third direction may be taken as a word line.

In some embodiments, a word line may be deposited and formed at a top surface of the gate structure located at a top layer of a column of gate structures in the third direction. The word line is connected to the gate structure located at the top surface, and is connected to every gate structure in the column of gate structures through the gate structure located at the top layer.

Figure 6F:
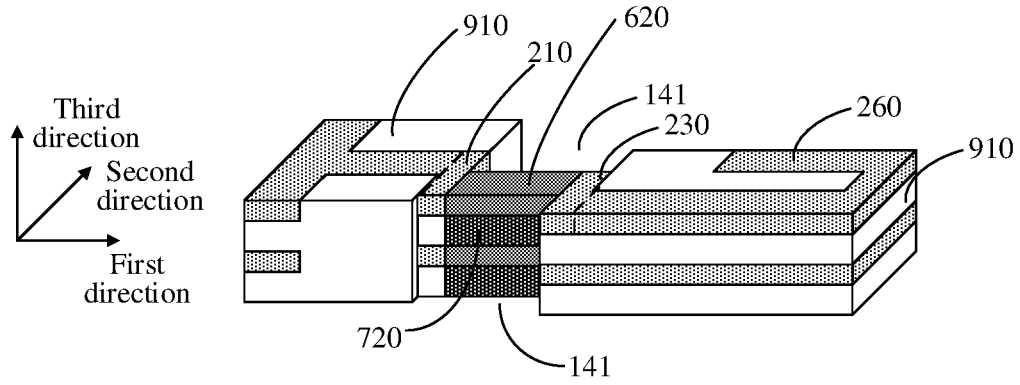
FIG. 6F illustrates a schematic diagram of a gate sub-trench formed in a method for forming a memory provided by the embodiments of the disclosure.
Figure 6G:
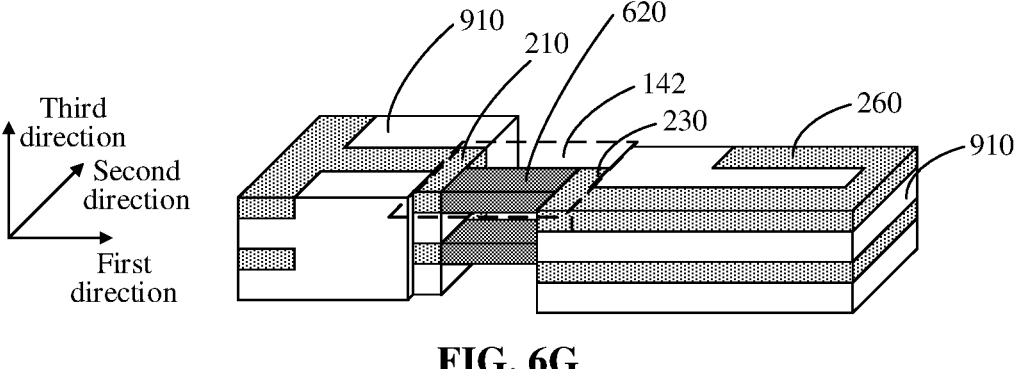
FIG. 6G illustrates a schematic diagram of a gate reserved area formed in a method for forming a memory provided by the embodiments of the disclosure.
Figure 6H:
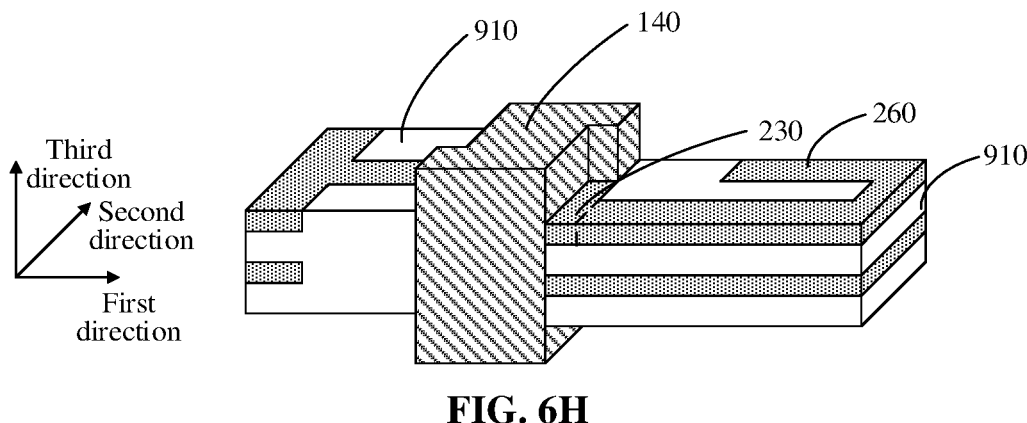
FIG. 6H illustrates a schematic diagram of a gate structure formed in a method for forming a memory provided by the embodiments of the disclosure.

For example, referring to FIG. 6F, FIG. 6G, and FIG. 6H, as shown in FIG. 6F, for each stack structure, a first filling layer 910 is deposited in gaps among first substrate sub-parts 210, in gaps among v third substrate sub-parts 230, and in gaps among sixth substrate sub-parts 260 in the stack structure, so as to form two gate sub-trenches 141 respectively located on both sides of the second stack sub-part 620 in the second direction. Then, the sacrificial layers 720 located at the second stack sub-part 620 are removed by etching, so as to communicate the two gate sub-trenches 141 located on both sides of the second stack sub-part 620 and form a gate reserved area 142 as shown in FIG. 6G. Then, gate structures 140 as shown in FIG. 6H may be deposited and formed in the gate reserved area 142 by a self-aligned process. The gate structures 140 arranged in a column formed in the same stack structure are sequentially connected in the third direction.

Figure 6I:
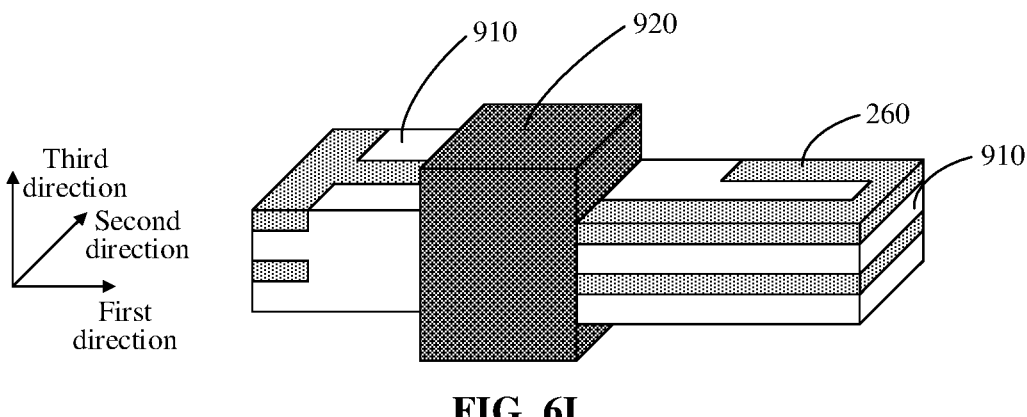
FIG. 6I illustrates a schematic diagram of a covering layer formed in a method for forming a memory provided by the embodiments of the disclosure.

In some embodiments, as shown in FIG. 6I, after the gate structure is formed, a covering layer 920 may be formed on the surface of the gate structures, the source structures, and the drain structures in each stack structure, so as to protect the gate structures, the source structures, and the drain structures in a subsequent process. During implementation, materials such as silicon nitride may be deposited on the surface of the gate structures, the source structures, and the drain structures of each stack structure, so as to form the covering layer.

Figure 6J:
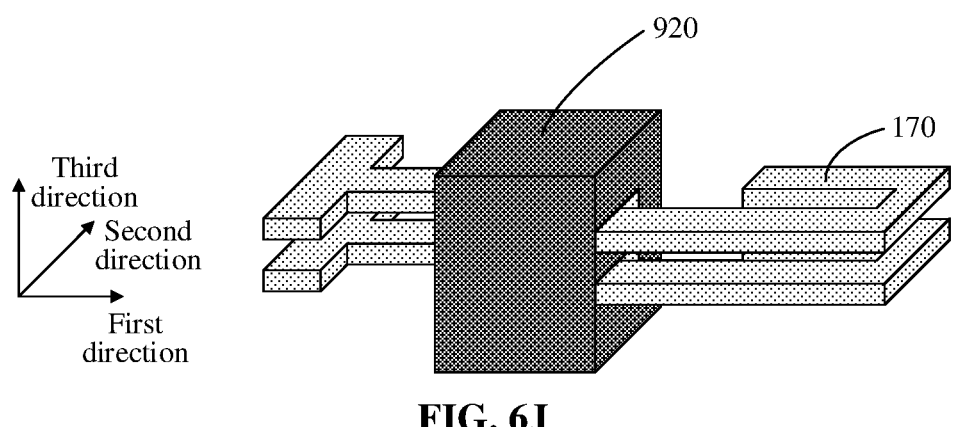
FIG. 6J illustrates a schematic diagram of a storage contact structure formed in a method for forming a memory provided by the embodiments of the disclosure.

In some embodiments, the source structure, the drain structure, and the storage contact structure are all doped with first ions with a first concentration. The trench is doped with second ions with a third concentration. Before the first electrode layer, the dielectric layer, and the second electrode layer are sequentially deposited on the surface of each storage contact structure to form the plurality of storage structures, the method may further include that: the storage contact structure is doped with the first ions with a second concentration. The second concentration is higher than the first concentration. During implementation, referring to FIG. 6H and FIG. 6J, the sixth substrate sub-part 260 may be doped with first ions with the second concentration after the first filling layer 910 is removed, so as to form a storage contact structure 170. In some embodiments, before the storage contact structure is doped with the first ions with the second concentration, the storage contact structure may also be siliconized, so as to reduce the resistance of the storage contact structure.

In some embodiments, each substrate further includes a seventh substrate sub-part connected to either the first substrate sub-part or the third substrate sub-part, not connected to the sixth substrate sub-part, of the substrate. The seventh substrate sub-parts, in the same row of the substrates and arranged in the first direction or the second direction, are connected with one another. The above-mentioned S605 may include the following steps.

At S641, a second filling layer is deposited and formed between the substrates in the same column.

At S642, part of the seventh substrate sub-parts of the substrates is removed by etching to form a plurality of bit line trenches.

At S643, a bit line is deposited and formed in each bit line trench.

Taking the case that the third substrate sub-part is connected to the sixth substrate sub-part, and the seventh substrate sub-part is connected to the first substrate sub-part as an example, continuously referring to FIG. 6B, each substrate 200 further includes a seventh substrate sub-part 270 connected to the first substrate sub-part 210 of the substrate 200.

During implementation, the material used to form the second filling layer by depositing and the material used to form the bit lines by depositing may be determined according to actual situations. No limits are made thereto in the embodiments of the disclosure. For example, the second filling layer may be formed by depositing the materials, such as an oxide, and the bit line may be formed by depositing conductive materials, such as a metal and/or polysilicon.

Figure 6K:
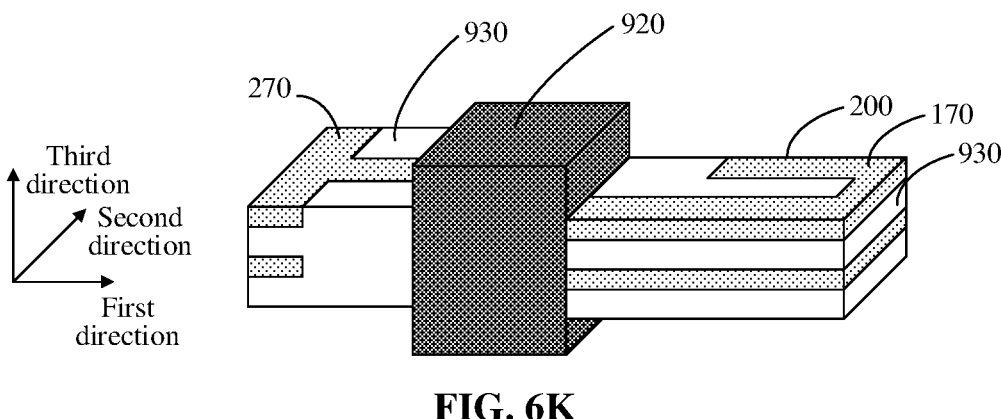
FIG. 6K illustrates a schematic diagram of a second filling layer formed in a method for forming a memory provided by the embodiments of the disclosure.
Figure 6L:
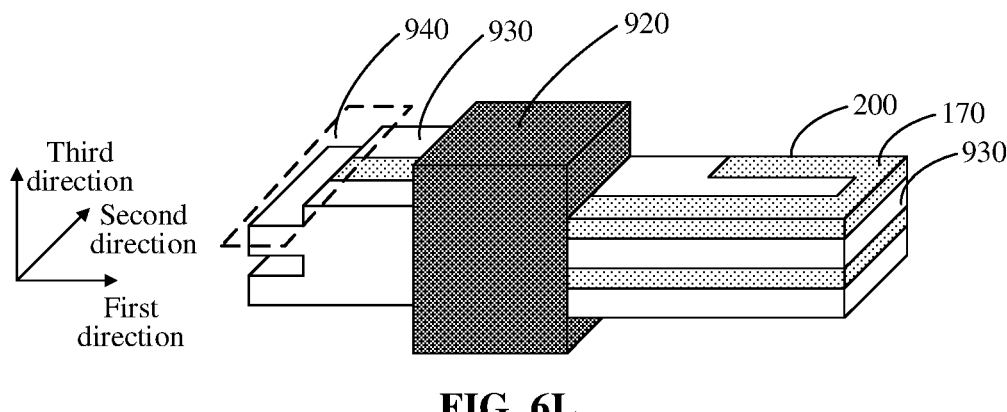
FIG. 6L illustrates a schematic diagram of a bit line trench formed in a method for forming a memory provided by the embodiments of the disclosure.
Figure 6M:
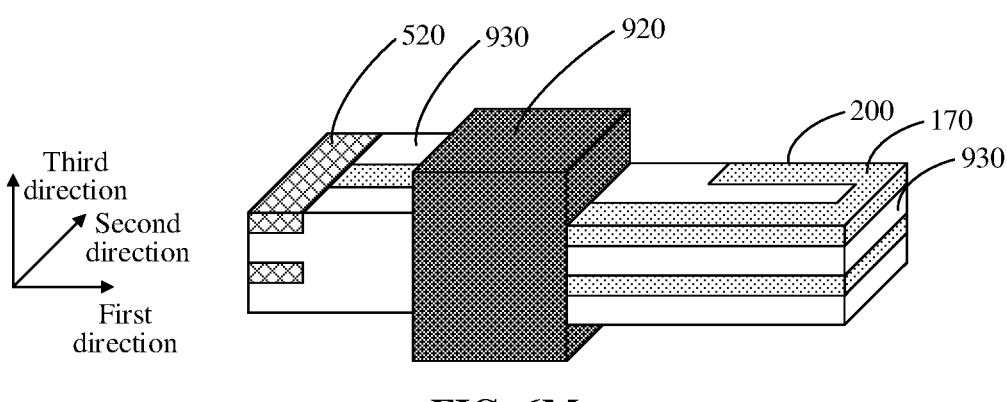
FIG. 6M illustrates a schematic diagram of a bit line formed in a method for forming a memory provided by the embodiments of the disclosure.
Figure 6N:
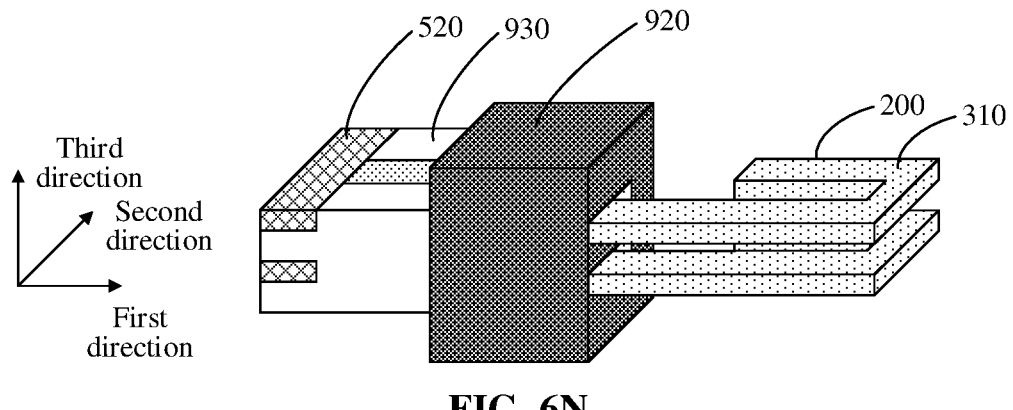
FIG. 6N illustrates a schematic diagram of a storage structure formed in a method for forming a memory provided by the embodiments of the disclosure.

For example, referring to FIG. 6K, FIG. 6L, and FIG. 6M, first, as shown in FIG. 6K, the second filling layer 930 may be deposited between the substrates 200 in the same column. Then, the seventh substrate sub-part 270 of each substrate 200 may be removed by etching to form a plurality of bit line trenches 940 as shown in FIG. 6L. Then, the bit line 520 as shown in FIG. 6M may be deposited and formed in each bit line trench 940. After the bit line 520 is formed, the second filling layer 930 may be removed by etching. After the second filling layer 930 is removed, a first electrode layer, a dielectric layer, and a second dielectric layer are sequentially deposited on the surface of each storage contact structure 170 to form a plurality of storage structures 310 as shown in FIG. 6N. It is to be noted that FIG. 6N only illustrates the situation that a plurality of storage structures are formed by sequentially depositing a first electrode layer, a dielectric layer, and a second electrode layer on a surface of each storage contact structure after the second filling layer between the storage contact structures is removed. In some embodiments, after the second filling layer is completely removed, a first electrode layer, a dielectric layer, and a second electrode layer may also be sequentially deposited on a surface of the storage contact structure, so as to form a plurality of storage structures. No limits are made thereto here.

The above-mentioned transistor embodiments, transistor formation method embodiments, semiconductor structure embodiments, semiconductor structure formation method embodiments, memory embodiments, and memory formation method embodiments have similar beneficial effects. The technical details not disclosed in the transistor embodiments, the transistor formation method embodiments, the semiconductor structure embodiments, the semiconductor structure formation method embodiments, the memory embodiments, and the memory formation method embodiments are understood with reference to the description of the transistor embodiments and the semiconductor structure embodiments.

In several embodiments provided by the disclosure, it is to be understood that the disclosed structure and method may be implemented in a non-target mode. The above described structure embodiments are only schematic. For example, the division of the units is only logical function division. In actual implementation, there may be other division modes, for example, a plurality of units or components may be combined, or may be integrated into another system, or some features may be ignored or not implemented. In addition, the components shown or discussed are coupled to each other, or directly coupled.

The above-mentioned units described as separate components may be, or may not be physically separated, and the components displayed as units may be, or may not be physical units, that is, they may be located in one place or distributed over a plurality of network units. Some or all of them may be selected according to actual needs to achieve the purpose of the embodiment.

The characteristics disclosed in several method or structure embodiments provided in the disclosure may be freely combined without conflicts to obtain new method embodiments or structure embodiments.

The above-mentioned descriptions are only some implementation modes of the disclosure, but the scope of protection of the embodiments of the disclosure are limited thereto. Any variation or replacement readily figured out by a person skilled in the art within the technical scope disclosed in the disclosure shall fall within the scope of protection of the disclosure.

What is claimed is:

1. A transistor, comprising:
a source structure, a trench, a drain structure, and a gate structure;
wherein the trench sequentially has a first end face and a second end face which are arranged opposite to each other in a first direction; the source structure extends from the first end face in a second direction; the source structure sequentially has a third end face and a fourth end face which are arranged opposite to each other in the first direction; the fourth end face is connected to the first end face; the drain structure extends from the second end face in a direction opposite to the second direction; the drain structure sequentially has a fifth end face and a sixth end face which are arranged opposite to each other in the first direction; the fifth end face is connected to the second end face; the second direction intersects the first direction; and
wherein the gate structure surrounds the trench and is connected to the fourth end face and the fifth end face.

2. The transistor of claim 1, wherein the gate structure comprises a first gate sub-part, a second gate sub-part, and a third gate sub-part sequentially connected in the first direction; the first gate sub-part and the source structure are sequentially connected in the second direction; the second gate sub-part completely surrounds the trench and is connected to the fourth end face and the fifth end face; the drain structure and the third gate sub-part are sequentially connected in the second direction; and in the first direction, a dimension of the first gate sub-part is the same as a dimension of the source structure, a dimension of the second gate sub-part is the same as a dimension of the trench, and a dimension of the third gate sub-part is the same as a dimension of the drain structure.

3. The transistor of claim 1, further comprising a source extension structure connected to the source structure, and a drain extension structure connected to the drain structure;
wherein both the source structure and the drain structure are doped with first ions with a first concentration, both the source extension structure and the drain extension structure are doped with first ions with a second concentration, the second concentration is higher than the first concentration; and wherein the trench is doped with second ions with a third concentration; and the first ions and the second ions have opposite polarities.

4. The transistor of claim 3, wherein the source extension structure and the source structure are sequentially connected in the first direction; the drain structure and the drain extension structure are sequentially connected in the first direction; or the source structure and the source extension structure are sequentially connected in the second direction; and the drain extension structure and the drain structure are sequentially connected in the second direction.

5. A semiconductor structure, comprising:

the transistor of claim 1, and a storage structure connected to the source structure or the drain structure in the transistor.

6. The semiconductor structure of claim 5, wherein the storage structure is connected to the source structure through a source extension structure and/or a metal silicide structure; or the storage structure is connected to the drain structure through a drain extension structure and/or the metal silicide structure.

7. The semiconductor structure of claim 5, wherein the storage structure comprises a first storage sub-part, a second storage sub-part, and a third storage sub-part;

the first storage sub-part and the source structure are sequentially connected in the first direction; the second storage sub-part extends from one end, far away from the source structure, of the first storage sub-part in the direction opposite to the second direction; the third storage sub-part extends from one end, far away from the first storage sub-part, of the second storage sub-part in the first direction; or the drain structure and the first storage sub-part are sequentially connected in the first direction; the second storage sub-part extends from one end, far away from the drain structure, of the first storage sub-part in the second direction; and the third storage sub-part extends from one end, far away from the first storage sub-part, of the second storage sub-part in a direction opposite to the first direction.

8. The semiconductor structure of claim 7, wherein in the second direction, a maximum dimension of the storage structure is the same as a maximum dimension of the transistor.

9. The semiconductor structure of claim 5, wherein the storage structure comprises a first storage sub-part, a second storage sub-part, and a third storage sub-part;

the source structure and the first storage sub-part are sequentially connected in the second direction; the second storage sub-part extends from one end, far away from the source structure, of the first storage sub-part in the first direction; the third storage sub-part extends from one end, far away from the first storage sub-part, of the second storage sub-part in the direction opposite to the second direction; or, the first storage sub-part and the drain structure are sequentially connected in the second direction; the second storage sub-part extends from one end, far away from the drain structure, of the first storage sub-part in a direction opposite to the first direction; and the third storage sub-part extends from one end, far away from the first storage sub-part, of the second storage sub-part in the second direction.

10. The semiconductor structure of claim 9, wherein in the first direction, a maximum dimension of the storage structure is the same as a maximum dimension of the transistor.

11. A method for forming a semiconductor structure, comprising:

providing a substrate, the substrate comprising a first substrate sub-part, a second substrate sub-part, and a third substrate sub-part sequentially connected in a first direction, and a sixth substrate sub-part connected to the first substrate sub-part or the third substrate sub-part; the second substrate sub-part sequentially having a first end face and a second end face which are arranged opposite to each other in the first direction; the first substrate sub-part extending from the first end face in a second direction, the first substrate sub-part sequentially having a third end face and a fourth end face which are arranged opposite to each other in the first direction, the fourth end face being connected to the first end face, the third substrate sub-part extending from the second end face in a direction opposite to the second direction, the third substrate sub-part sequentially having a fifth end face and sixth end face which are arranged opposite to each other in the first direction, the fifth end face being connected to the second end face, and the second direction intersecting the first direction;

respectively doping the first substrate sub-part, the second substrate sub-part, the third substrate sub-part, and the sixth substrate sub-part with ions, so as to form a source structure a trench, a drain structure, and a storage contract structure;

forming a gate structure surrounding the trench and connected to the fourth end face and the fifth end face by depositing; and sequentially depositing a first electrode layer, a dielectric layer, and a second electrode layer on a surface of the storage contact structure, so as to form the storage structure.

12. A memory, comprising:

a plurality of semiconductor structures of claim 5 arranged in an array, a plurality of word lines, and a plurality of bit lines, wherein the plurality of semiconductor structures arranged in an array comprise a plurality of columns of the semiconductor structures arranged in the first direction or the second direction; each column of the semiconductor structures comprises the semiconductor structures arranged in a third direction; each of the word lines is connected to gate structures of transistors in a column of semiconductor structures; each of the bit lines is connected to either source structures or drain structures, not connected to the storage structures, of a row of the semiconductor structures arranged in the first direction or the second direction; and the third direction intersects both the first direction and the second direction.

13. A method for forming a memory, comprising:

providing a plurality of columns of substrates arranged in a first direction or a second direction, each column of the substrates comprising the substrates arranged in a third direction; the first direction, the second direction, and the third direction intersecting each other; a substrate comprising a first substrate sub-part, a second substrate sub-part, and a third substrate sub-part sequentially connected in the first direction, and a sixth substrate sub-part connected to the first substrate sub-part or the third substrate sub-part, the second substrate sub-part sequentially having a first end face and a second end face which are arranged opposite to each other in the first direction, the first substrate sub-part extending from the first end face in the second direction, the first substrate sub-part sequentially having a third end face and a fourth end face which are arranged opposite to each other in the first direction, the fourth end face being connected to the first end face, the third substrate sub-part extending from the second end face in a direction opposite to the second direction, the third substrate sub-part sequentially having a fifth end face and a sixth end face which are arranged opposite to each other in the first direction, the fifth end face being connected to the second end face;

doping the first substrate sub-part, the second substrate sub-part, the third substrate sub-part, and the sixth substrate sub-part of the substrate with ions, so as to form a source structure, a trench, a drain structure, and a storage contract structure respectively corresponding to the first substrate sub-part, the second substrate sub-part, the third substrate sub-part, and the sixth substrate sub-part;

forming gate structures on the doped substrate by depositing and forming word lines, each of which is connected to the gate structures of a column of the substrates, a gate structure surrounding the trench in the substrate and being connected to the fourth end face and the fifth end face in the substrate;

sequentially depositing a first electrode layer, a dielectric layer, and a second electrode layer on a surface of the storage contact structure, so as to form a storage structure; and forming a plurality of bit lines, each of the bit lines being connected to either source structures or drain structures, not connected to storage structures, of a row of the substrates arranged in the first direction or the second direction.

14. The method of claim 13, wherein the providing a plurality of columns of substrates arranged in a first direction or a second direction comprises:

providing a base, the based comprising at least one stack structure arranged in the first direction or the second direction, the stack structure comprising a plurality of sacrificial layers and a plurality of substrate layers alternately stacked in the third direction, the stack structure comprising a first stack sub-part, a second stack sub-part, and a third stack sub-part sequentially connected in the first direction, and a fourth stack sub-part connected to the first stack sub-part or the third stack sub-part; the second stack sub-part sequentially having a seventh end face and an eighth end face which are arranged opposite to each other in the first direction, the first stack sub-part extending from the seventh end face in the second direction, and the third stack sub-part extending from the eighth end face in the direction opposite to the second direction; and removing the sacrificial layers located at the first stack sub-part the third stack sub-part, and the fourth stack sub-part of the stack structure by etching, a substrate layer in the first stack sub-part taken as the first substrate sub-part, the substrate layer in the third stack sub-part being taken as the third substrate sub-part, the substrate layer in the fourth stack sub-part being taken as the sixth substrate sub-part, and the substrate layer in the second stack sub-part being taken as the second substrate sub-part.

15. The method of claim 14, wherein the second stack sub-part sequentially has ninth end face and a tenth end face which are arranged opposite to each other in the second direction; the removing the sacrificial layers located at the first stack sub-part, the third stack sub-part, and the fourth stack sub-part of the stack structure by etching comprises:

etching the sacrificial layers in the stack structure in the second direction by taking a plane where the ninth end face is located as an etching stop surface and in the direction opposite to the second direction by taking a plane where the tenth end face is located as an etching stop surface, so as to remove part of the sacrificial layers located at the first stack sub-part, the third stack sub-part, and the fourth stack sub-part; and after removing the part of the sacrificial layers, etching the sacrificial layers in the stack structure in the first direction by taking a plane where the seventh end face is located as an etching stop surface and in a direction opposite to the first direction by taking a plane where the eighth end face is located as an etching stop surface, so as to remove the remaining sacrificial layers located at the first stack sub-part, the third stack sub-part, and the fourth stack sub-part.

16. The method of claim 14, wherein the forming gate structures on the doped substrates by depositing and forming word lines, each of which is connect to the gate structures of a column of the substrates comprises:

depositing a first filling layer in gaps among first substrate sub-parts in gaps among third substrate sub-parts, and in gaps among sixth substrate sub-parts in the stack structure, so as to form two gate sub-trenches respectively located on both sides of the second stack sub-part in the second direction;

removing the sacrificial layers located at the second stack sub-part, so as to communicate the two gate sub-trenches located on both sides of the second stack sub-part and form a gate reserved area;

depositing and forming the gate structures in the gate reserved area by a self-aligned process, wherein the gate structures arranged in a column formed in the same stack structure are sequentially connected in the third direction; and forming the word lines, each of which is connected to a column of the gate structures.

17. The method of claim 13, wherein the substrate further comprises a seventh substrate sub-part connected to either the first substrate sub-part or the third substrate sub-part, not connected to the sixth substrate and arranged in the first direction or the second direction, are connected with one another;

the forming a plurality of bit lines, each of the bit lines being connected to either the source structures or the drain structures, not connected to the storage structures, of a row of the substrates arranged in the first direction or the second direction comprises:

forming a second filling layer between the substrates in the same column by depositing;

removing part of the seventh substrate sub-parts from of substrates by etching to form a plurality of bit line trenches; and forming a bit line in each bit line trench by depositing.

* * * * *